United States Patent
Cohen et al.

[19]

[11] Patent Number: 5,914,889
[45] Date of Patent: Jun. 22, 1999

[54] METHOD AND SYSTEM FOR GENERATING A MASK LAYOUT OF AN OPTICAL INTEGRATED CIRCUIT

[75] Inventors: Leonard George Cohen, Atlanta, Ga.; Charles Howard Henry, Skillman, N.J.; Yuan P. Li, Duluth, Ga.; Morton I. Schwartz, Alpharetta, Ga.; Yan Wang, Chamblee, Ga.; Henry Howard Yaffe, Reisterstown, Md.

[73] Assignee: Lucent Technologies Inc., Murray Hill, N.J.

[21] Appl. No.: 08/713,582

[22] Filed: Sep. 13, 1996

[51] Int. Cl.⁶ .............................. G06F 17/00; G06F 17/50
[52] U.S. Cl. ............................................. 364/491; 364/490
[58] Field of Search ..................................... 364/488, 489, 364/490, 491; 395/500; 385/14, 50, 129

[56] References Cited

U.S. PATENT DOCUMENTS

| | | | |
|---|---|---|---|
| 4,651,284 | 3/1987 | Watanabe et al. | 364/491 |
| 4,902,086 | 2/1990 | Henry et al. | 350/96.12 |
| 5,333,000 | 7/1994 | Hietala et al. | 342/368 |
| 5,340,700 | 8/1994 | Chen et al. | 430/312 |
| 5,385,632 | 1/1995 | Goosen | 156/630 |
| 5,440,720 | 8/1995 | Baisuck et al. | 395/500 |
| 5,459,801 | 10/1995 | Snitzer | 385/30 |
| 5,563,970 | 10/1996 | Little et al. | 385/42 |
| 5,605,856 | 2/1997 | Goosen et al. | 437/51 |
| 5,636,309 | 6/1997 | Henry et al. | 385/129 |
| 5,719,976 | 2/1998 | Henry et al. | 385/50 |
| 5,745,618 | 4/1998 | Li | 385/46 |
| 5,745,619 | 4/1998 | Li et al. | 385/48 |
| 5,757,469 | 5/1998 | Allen | 355/53 |

*Primary Examiner*—Kevin J. Teska
*Assistant Examiner*—Vuthe Siek

[57] ABSTRACT

A computer system and method provide a CAD tool by which a mask for an application specific optical integrated circuit, chip, or wafer may be generated both easily and quickly. The method involves the step of receiving the design for an optical circuit with the circuit design including at least one optical component. Each optical component in the optical circuit is defined by one or more geometric shapes, such as a trapezoid, rectangle, or an arcuate polygon. The method further includes the step of retrieving parameters which define the manufacturing standard by which the optical circuit will be fabricated as well as parameters which define the optical components in the optical circuit. Based on the parameters and the geometric shapes, a plot is generated which forms a mask layout for the optical circuit. The mask layout can then be viewed by a graphical editor whereby a designer can receive visual confirmation that the mask layout accurately portrays the desired optical circuit, chip, or wafer.

27 Claims, 38 Drawing Sheets

FIG. 10(A)

CommonParam  ChipMaskLib  EndPorts  DeviceLibrary  In

View
Modify
Help

33c

102

```
# ################################################
     General designing parameters              #
################################################
0.125    -->  Litho grid size [um]
400      -->  Nsteps in digitizing a curve
250      -->  hfib; vertical waveguide separation [um]
1.0      -->  scalex; scaling factor in x-direction
1.0      -->  scaley; scaling factor in y-direction
1        -->  levg; mask level of the waveguide
9        -->  levo; mask level of the outline
99       -->  levt; mask level of the text
1800     -->  length of saw marker at the end of chip
15000    -->  bend radius for Rfan connection (min=15000) [um]
2        -->  index; set to different fabrication specification
```

General Parameters

Save File

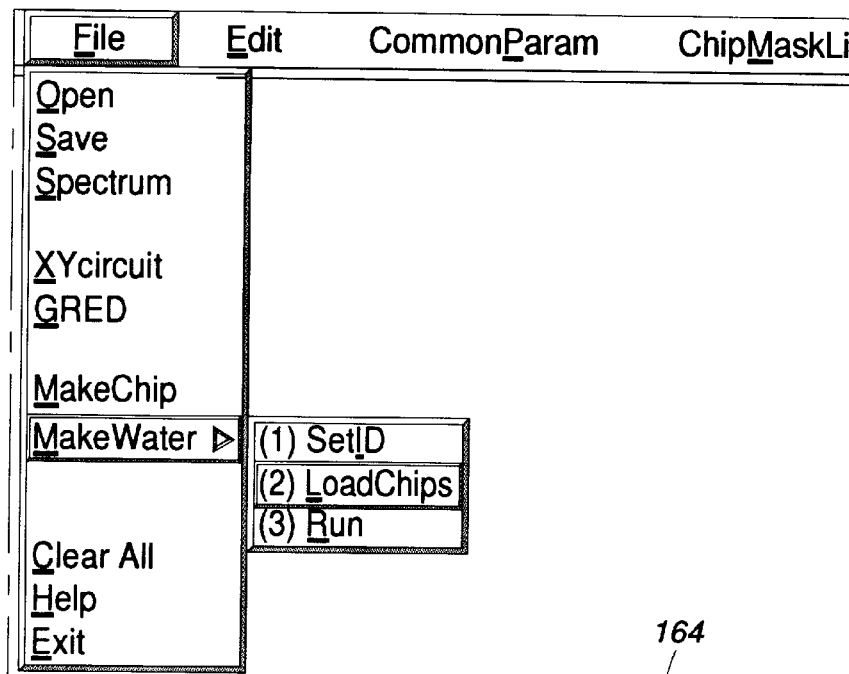
FIG. 16(B)
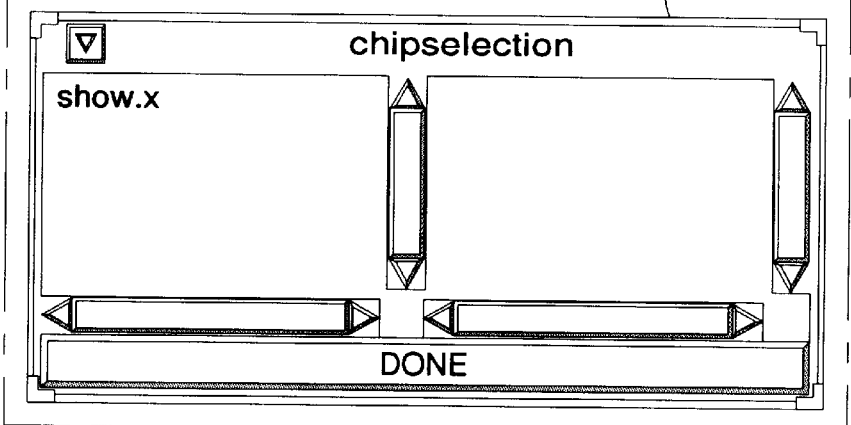
FIG. 16(C)
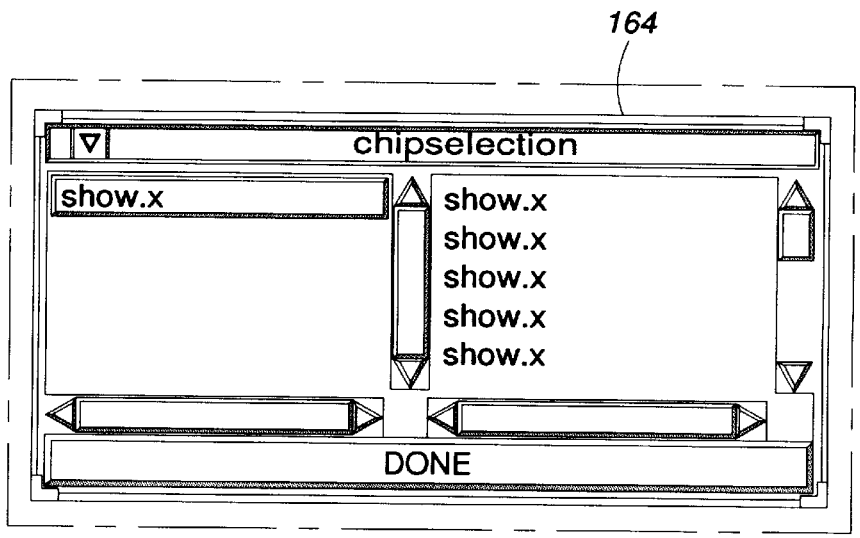

FIG. 18(G)  BLOCK TEXT

FIG. 18(H)  STICK TEXT

METHOD AND SYSTEM FOR GENERATING A MASK LAYOUT OF AN OPTICAL INTEGRATED CIRCUIT

FIELD OF THE INVENTION

This invention generally relates to a method and system for generating a mask layout of an optical integrated circuit and, more particularly, to a computer system and computer-implemented method in which an optical circuit can be laid out and viewed.

BACKGROUND OF THE INVENTION

Presently, the design and layout of an optical integrated circuit requires the assistance of an expert circuit designer, which is often a waveguide physicist who is also a highly experienced programmer. The expert designer is presented with a task of designing and laying out an optical circuit that provides certain functionalities. For instance, the expert designer may be presented with the task of designing a certain Mach-Zehnder interferometer that has a certain response at a particular wavelength.

One of the first steps in the design of an optical circuit is the determination of the circuit's defining parameters. For a Mach-Zehnder interferometer, one of these parameters would be the difference in path lengths between the two arms of the Mach-Zehnder interferometer. To find the proper values for the parameters of a circuit, the expert designer must write a program, such as a Fortran program, that provides a spectral analysis for the desired circuit. In the example of the Mach-Zehnder interferometer, the expert designer would write a program that would provide a spectral analysis of the Mach-Zehnder interferometer at the specified path difference. The expert designer could therefore verify the operation of a particular optical circuit having certain specified dimensions and parameters.

Once the dimensions and parameters for the optical circuit are known, the expert designer next writes a second program for laying out the optical circuit. This second program provides an x-y plot by which a fabricating machine, such as a photolithographic machine, can lay out a desired mask. The mask which is defined by this second program must be very accurate in specifying path lengths and must be able to define various curves in order that the optical circuit perform as desired.

More specifically, one manner in which the second program defines the mask of the optical circuit is by selectively calling a number of subroutines from a library of subroutines. In general, each of the subroutines in the library defines a unique structure. For instance, one subroutine might define a curved bend between two points with a certain radius of curvature and a certain width. An entire set of subroutines might be necessary to define the various portions and structures of a Mach-Zehnder interferometer. The second program selectively calls these subroutines and provides the subroutines with the necessary data or parameters to define the desired optical circuit.

The design and layout of the optical circuit is an extremely complex and involved process. Since the process requires the expertise of one skilled in waveguide physics as well as in computer programming, only a relatively small and select group of people are qualified to design and layout an optical circuit.

The process of designing and laying out an optical circuit is also a rather lengthy process and frequently takes as long as a month. One reason for this long overall design time is that the expert designer or team of designers must write, as well as debug, two different programs for each optical circuit that they design with one program providing a spectral analysis and the other program defining the mask layout. While the programs for another optical circuit may be derived from an existing set of programs for a similar circuit, the programs for the other circuit are nonetheless unique and must be written and debugged for the new circuit. For instance, a Mach-Zehnder interferometer having the same dimensions would still require different programs even if the only difference between the two devices was the index of refraction for the substrate material.

Another challenge facing the expert circuit designer is that a substantial amount of data must be tracked during the design and layout of an optical circuit. Each optical component in an optical circuit is defined by a number of parameters, such as length of waveguides, path difference between waveguides, separation between waveguides, radius of curvature in the waveguides, etc. The large number of parameters for each optical component therefore renders the process of writing the programs for both the spectral analysis and layout of an optical circuit extremely exacting.

A further challenge facing an expert optical circuit designer is the ability to visually verify an optical circuit. During the mask layout phase of the circuit design, the contours of the circuit is defined by a set of coordinates. Due to the large number of coordinates, the exact relationship between the coordinates is not readily apparent from studying the coordinates. To provide a visual confirmation of the circuit, a graphical editor program may be employed. The graphical editor program connects the various points in the mask layout and forms shapes and contours which together provide a visual image of the optical circuit. Since a visual confirmation of the optical circuit does not occur until after the expert designer has written and debugged two programs, the expert designer must exert a substantial amount of time and effort before receiving visual confirmation of the desired circuit.

The challenges facing the expert designer do not stop at the circuit level but are also prevalent at the chip and wafer level. Once the individual circuits have been designed and laid out, the expert designer must additionally write and debug programs to combine the circuits onto a chip or to combine various chips onto a single wafer. These programs will, inter alia, add the various labels and markers on the wafer relied upon in the fabrication of the chips.

In the electrical arts, one skilled in the art is provided with computer-aided design (CAD) tools for designing and laying out electrical circuits. In the development of the electrical CAD tools, an expert circuit designer would design and layout building blocks of electrical circuits, such as AND gates, OR gates, and multiplexers, on the transistor level for a particular technology, such as 0.5 micron CMOS. One familiar with the functions of these elements could then use the CAD tool to selectively combine the basic building blocks to form a desired electrical circuit. The electrical CAD tool would additionally generate a mask layout for the various semiconductor devices.

The design of optical circuits, in contrast to electrical circuits, has considerations which cannot be directly translated from the electrical arts. For instance, the length and shape of an optical waveguide plays a much more significant role on the proper functioning of the circuit than the length and shape of an electrical conductor. A sharp bend in an optical waveguide can introduce an unacceptable loss in signal whereas in the electrical arts, an electrical conductor is commonly laid out with ninety degree bends and is not rendered inoperable simply by the shape of the conductor. Thus, the underlying physics of optical signals and optical circuits prevent the simple translation of an electrical CAD tool into an optical CAD tool.

Another difficulty in the design of optical circuits is that the planar waveguide technology is still evolving and key waveguide factors related to process parameters are not fixed. With each change in technology, such as a change in substrate material, the programs for an optical circuit must be at least modified and debugged. Thus, even if a CAD tool was developed for a single technology, the CAD tool would soon become outdated when new technologies were developed.

The availability of new optical circuits is becoming of more and more significance as the technology is shifting from electrical communication to optical communication. An impediment to this transition from electrical to optical is the cost of optical technology, which is highly dependent upon the number of interconnects between optical devices. Since the cost of the optical devices can be drastically reduced by integrating existing optical devices onto a single substrate, thereby reducing the number of interconnects, a number of new optical circuits will have to be designed. In order to expedite this transition, the expert designer must be able to reduce the overall time needed to design and layout an optical circuit.

In summary, a need exists for a system or process which can assist in the design and layout of an optical circuit. Moreover, a need exists for a system or method which can significantly reduce the amount of time needed to design and layout a circuit and one that can greatly simplify the process whereby one, who is neither a waveguide physicist or a programmer, can design and layout an optical circuit. A need also exists for a system or method which can provide a designer with a visual confirmation of the desired circuit at various stages throughout the design process. Furthermore, a need exists for a method or system which can assist in the design of an optical circuit for various types of technologies, as well as for technologies embodying future advances.

SUMMARY OF THE INVENTION

The present invention, in preferred embodiments, is a computer-implemented method and a computer system for generating a mask layout of an optical integrated circuit. With the invention, a design for an optical circuit is received with the design of the optical circuit including at least one optical component. Each such optical component in the optical circuit is defined by at least one geometric shape, such as a rectangle, trapezoid, or arcuate polygon. Before the mask layout can be generated, parameters are retrieved for defining a manufacturing standard by which the optical circuit will be fabricated and for defining dimensions of each geometric shape for the circuit. A plot is then generated based on the geometric shapes defining the optical components with this plot representing a mask layout of the various waveguides in the optical circuit. Preferably, the mask layout can be viewed so as to receive visual confirmation that the circuit is the desired optical circuit.

The principles and features of the present invention will be more readily apparent and understood from the following detailed description, read in conjunction with the accompanying drawings.

BRIEF DESCRIPTION OF THE DRAWINGS

The present invention can be better understood with reference to the following drawings. Note that like reference numerals designate corresponding parts throughout the several views.

FIG. 10(A) is view of a display screen showing a listing of common parameters under a "CommonParam" heading;

FIGS. 16(A) to 16(F) are view of display screens depicting a process by which a wafer can be designed and laid out;

FIGS. 18(A) to 18(H) are plots of basic geometric shapes generated by a mask layout driver according to the invention;

DETAILED DESCRIPTION

I. Overview

The invention, in general, relates to a computer system, preferably a computer-aided design (CAD) tool, which provides a non-expert designer the capability to design an optical application specific integrated circuit (OASIC). The computer system has a library of devices, interconnects, and end ports from which a user can selectively combine to form an optical circuit. More specifically, the devices preferably at least include a straight waveguide, a directional coupler, a Mach-Zehnder, a fourier filter, a resonant coupler, an adiabatic coupler, an adiabatic Y, a router, and a star coupler. The interconnects at least include an Rfan, an SPJ, a Ujoin, and a taper join and the end ports at least include a normal end, a taper end, and a terminator.

When a user selects one of the components, such as a device, an icon for the device appears on a canvas. The icon represents the particular device and therefore has the same number of ports. The user can add devices to the canvas, interconnect the devices with any of the interconnects, and selectively add end ports. To analyze the properties of a circuit on the canvas, the user can invoke a Spectrum tool which provides a transmission spectrum of power versus wavelength for an optical path within the circuit. To optimize the properties between any two ports of the circuit, the user can modify characteristics of the individual components or all components until the desired spectral analysis is obtained.

The user can also have a mask file produced for an optical circuit. The mask file is an xy plot of the optical circuit in a .x format which can be read by a machine fabricating the optical circuit. The .x format of the optical circuit is also read by a graphical editor, such as "GRED" which was developed by AT&T. The graphical editor displays the circuit as it will be fabricated and has an option so that the width of the circuit can be expanded to more easily view the components of the optical circuit.

The computer system according to the invention can combine circuits on screen to make chips and can combine chips to make wafers. With the mask layout driver, both the chips and the wafers can be converted into a .x file format with the appropriate marker and labels being added for fabrication. The .x file formats of the chips and wafers may also be viewed with the graphical editor prior to fabrication.

II. Hardware and Graphical User Interface

Figure 1:
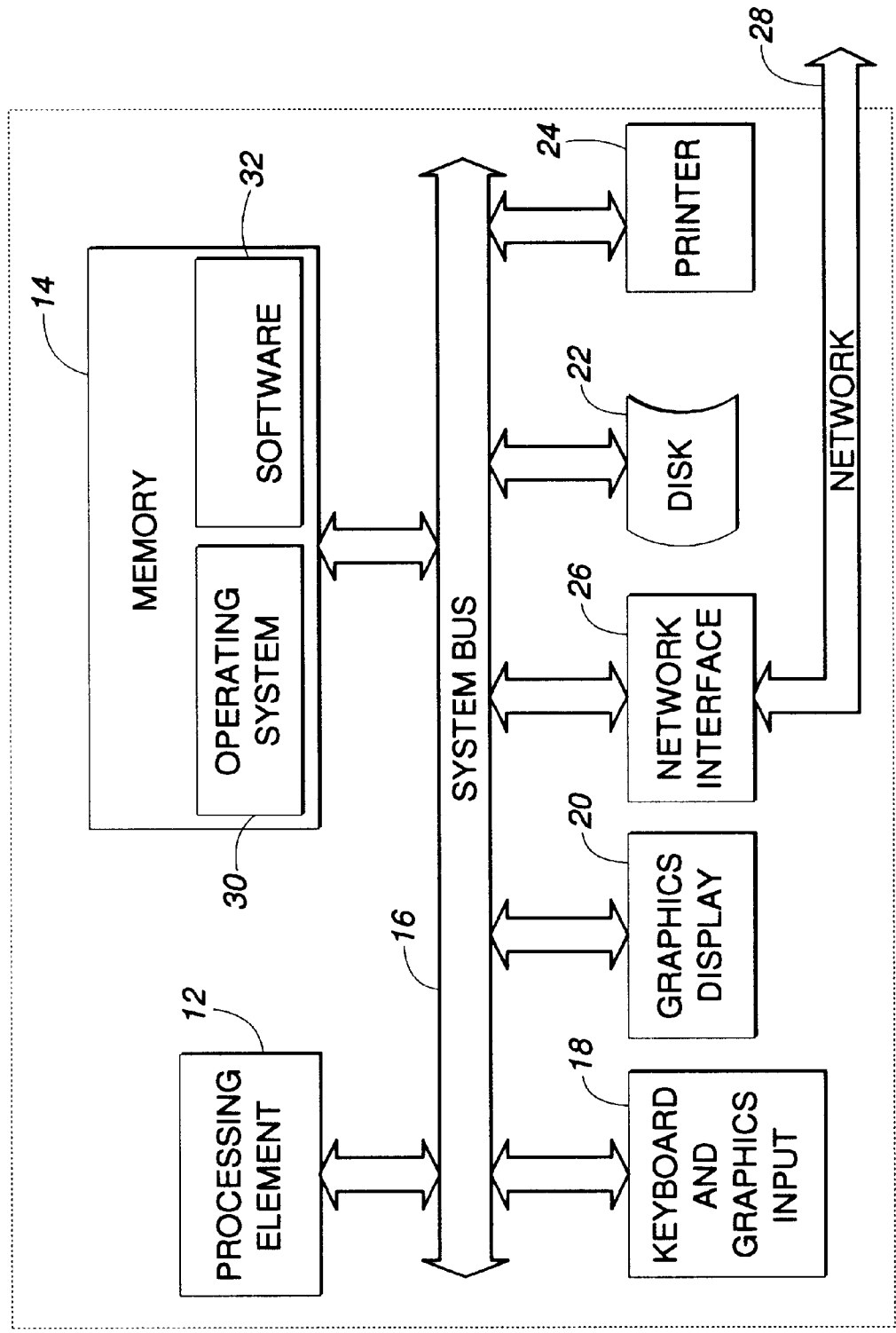
FIG. 1 is a block diagram of a preferred embodiment of a computer system according to the invention.

With reference to FIG. 1, a computer system 10 according to a preferred embodiment of the invention comprises a processing element 12 interconnected with memory 14 through a system bus 16. The processing element 12 receives inputs through a keyboard and graphics input 18 and generates images which are displayed on a graphics display 20. The keyboard and graphics input 18 preferably comprises a computer keyboard and a mouse, although other types of input devices may be used. The computer system 10 further comprises a disk storage 22 and a printer 24 and is connected to a network 28 through a network interface 26. An operating system 30 and software 32 are stored within memory 14.

In the preferred embodiment, the computer system 10 comprises a SunSparc 20 computer and the operating system 30 is Solaris 2.3. While the computer system 10 need not be connected to the network 28, the computer system 10 is preferably connected to the network 28 so as to be available to other computers or computer networks connected to the network 28. The computers connected to the computer system 10 through the network 28 are preferably configured with an Xserver and a TCP/IP stack. It should be understood that the invention is not limited to the preferred structure and software listed above but may be embodied in any suitable computer system and with any suitable software.

Figure 2:
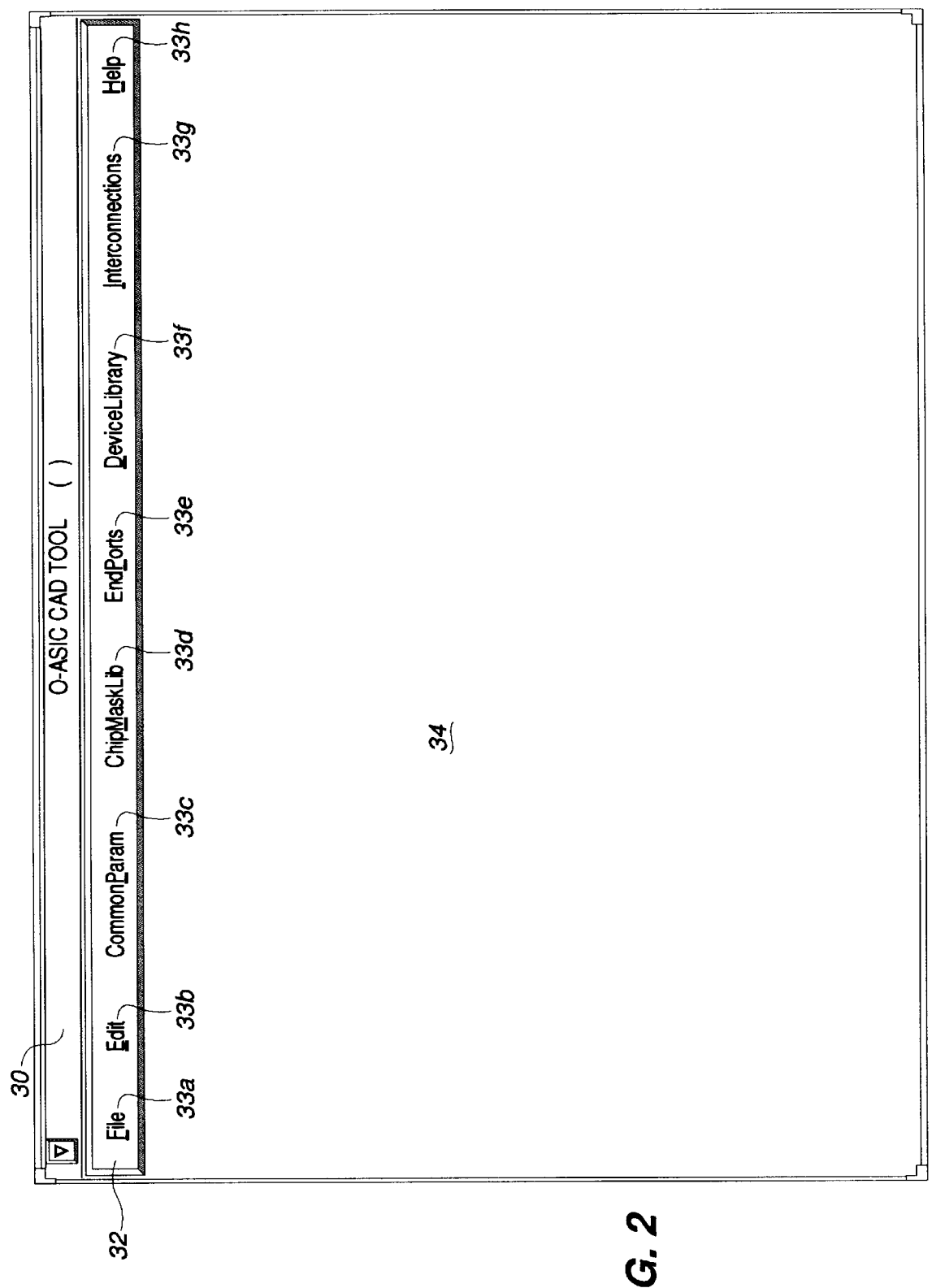
FIG. 2 is a view of a display screen showing an empty canvas, a title bar, and a menu bar.
Figure 4A:
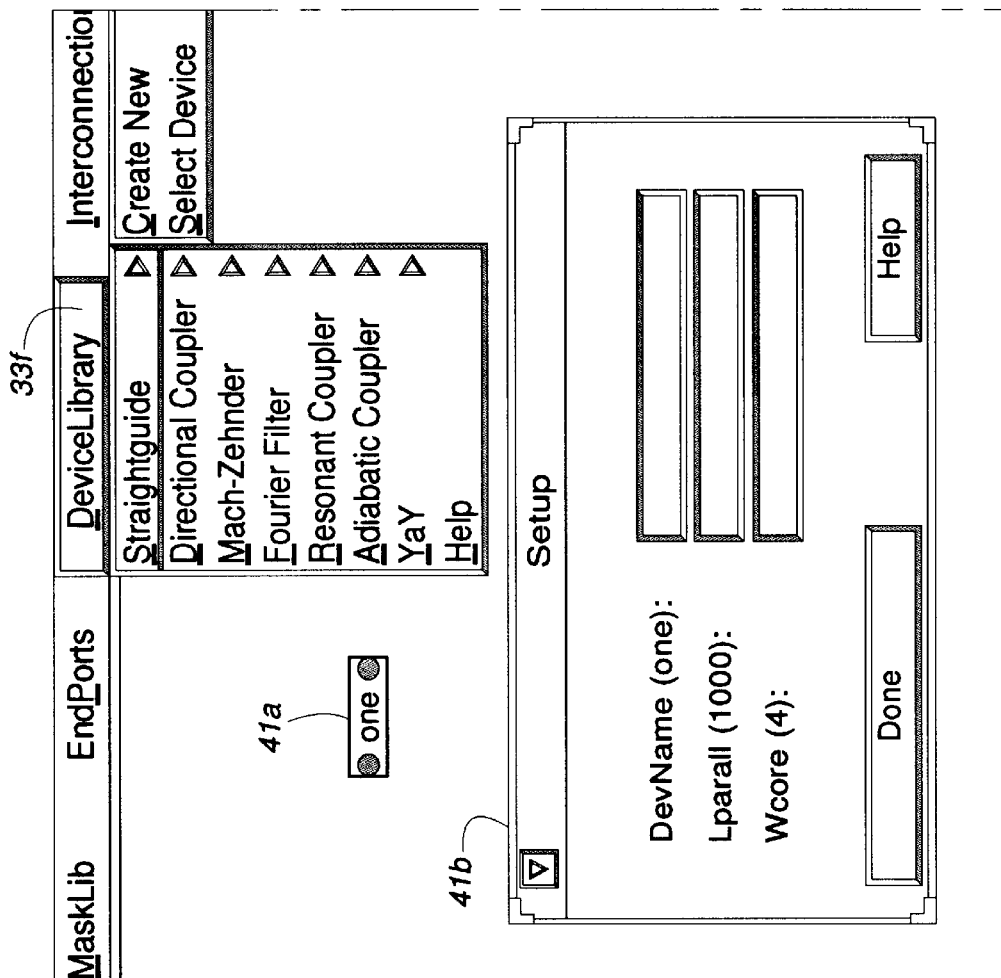
FIGS. 4(A) to (G) are views of display screens showing optical device icons along with their local parameters.

The software 32, inter alia, provides a user-friendly graphical user interface on the display 20, one screen of which is shown in FIG. 2. The interface has a title bar 30 entitled O-ASIC, which stands for Optical Application Specific Integrated Circuit, and has a menu bar 32 with a number of headings 33. Underneath the menu bar 32 is an open canvas 34 upon which an optical circuit can be designed, laid-out, and analyzed. The menu driven portion of the software 32 is preferably developed using Tcl/Tk toolkit.

Figure 3:
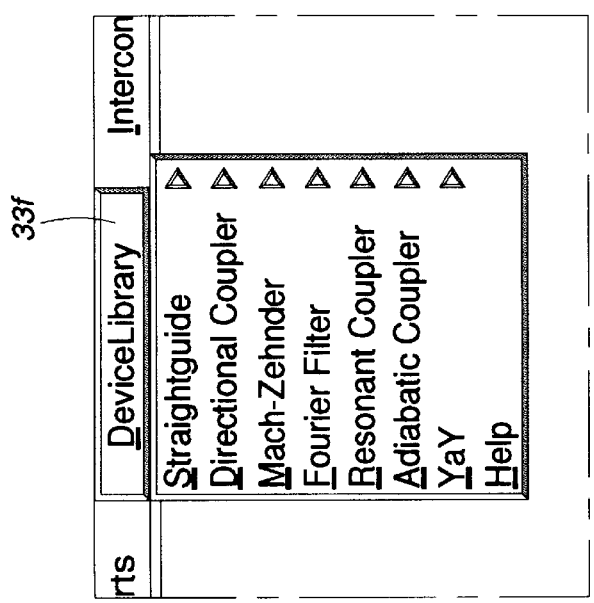
FIG. 3 is a view of a display screen showing a listing of optical devices under a "Device Library" heading.

With reference to FIG. 3, upon selection of the "Device Library" heading 33f, the user is presented with a listing of optical devices that may be selected. For instance, these devices preferably include a straight waveguide, a directional coupler, a Mach-Zehnder interferometer, a fourier filter, a resonant coupler, an adiabatic coupler, an adiabatic Y, and a Y branch YaY. While the software 32 preferably has as many devices as possible, the software 32 could be limited to a smaller number of devices.

To select one of the devices, the cursor is placed on the desired device and the left mouse button is clicked once. To position an icon of a device on the canvas, the cursor is moved to a desired position on the canvas and the left mouse is double clicked, thereby introducing the icon for that device at the desired location. The icon can then be moved to another location by placing the cursor on the icon and holding down the left mouse button while the cursor and icon are moved to the new location. Icons 41a to 47a for the straight waveguide, directional coupler, Mach-Zehnder interferometer, fourier filter, resonant coupler, an adiabatic coupler, and the Y branch are respectively shown in FIGS. 4(A) to 4(G).

Figure 5:
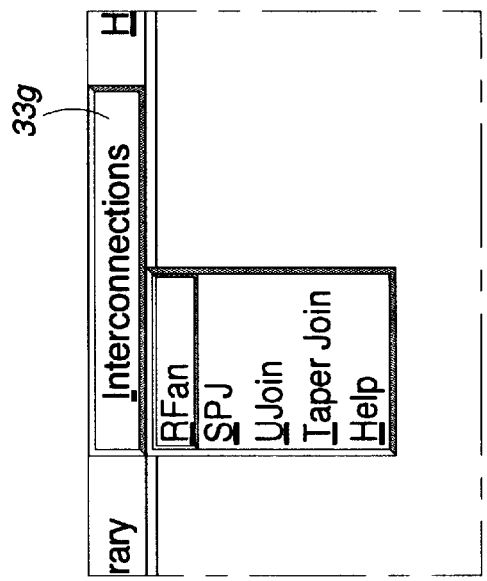
FIG. 5 is a view of a display screen showing a listing of optical interconnects under an "Interconnections" heading.

Upon selection of the "Interconnections" heading 33g, the user is presented with a listing of interconnections, as shown in FIG. 5. These interconnections preferably at least include a raised cosine function interconnect (Rfan), a smooth polynomial join (SPJ), a U-turn type interconnect (Ujoin), and a horizontal connection between two ports of equal or unequal widths (Taper Join). As with the selection of a device, an icon for an interconnect is selected by placing the cursor on the desired device and clicking the left mouse button once. Next, the cursor is placed on the desired port of an input device and the left mouse button is double clicked to define the input port for the interconnect. The output port of the interconnect is next defined by placing the cursor on the desired port of an output device and double clicking the left mouse button. With this action, a single line will be displayed showing the connection between the selected ports of the input and output devices. FIGS. 6(A) to 6(D) illustrate icons 61a to 64a for the Rfan, SPJ, UJoin, and Taper Join interconnects, respectively.

Figure 7:
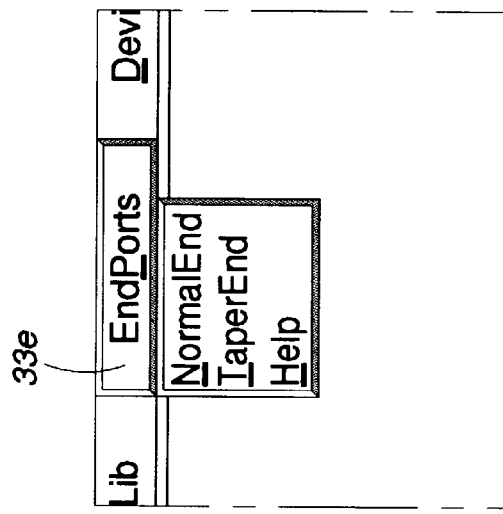
FIG. 7 is a view of a display screen showing a listing of optical end ports under an "EndPorts" heading.
Figure 6D:
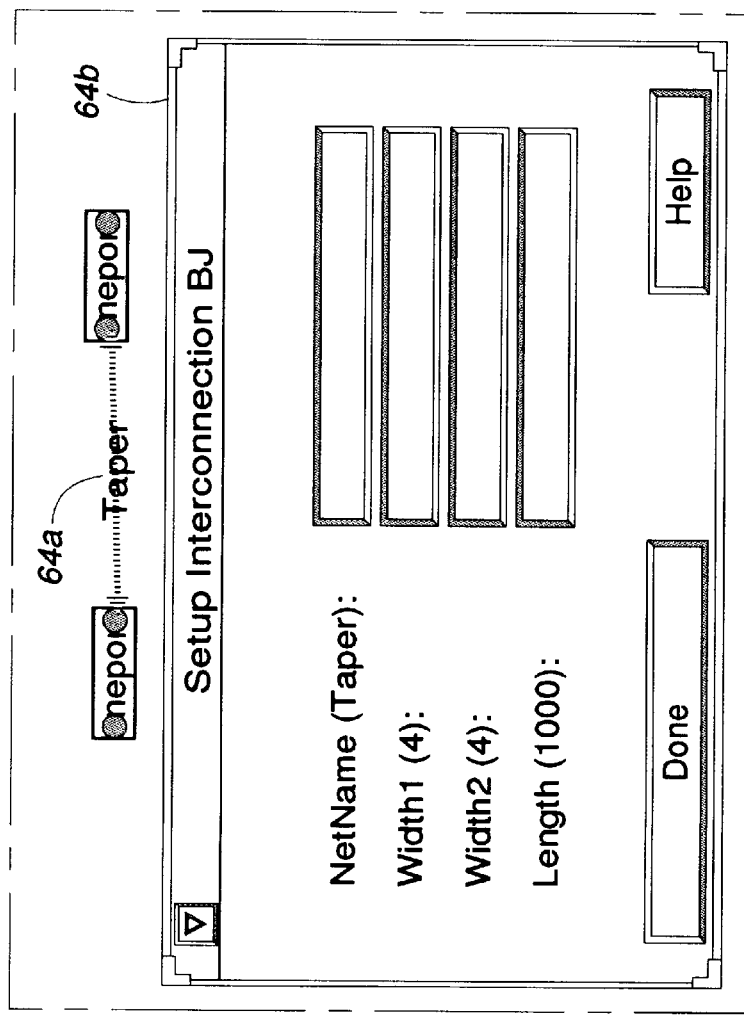

A user can also finish a circuit by selecting and placing end ports on the circuit. As shown in FIG. 7, by selecting the "EndPorts" heading 33e, a user is presented with a listing of available end ports, which preferably include both normal and taper end ports. The normal end port has a waveguide end with a width unchanged from the waveguide on the circuit. The taper end port has a width that varies from one that matches the width of the waveguide in the circuit to one that provides a better match to a fiber connected to the circuit.

Figure 8A:
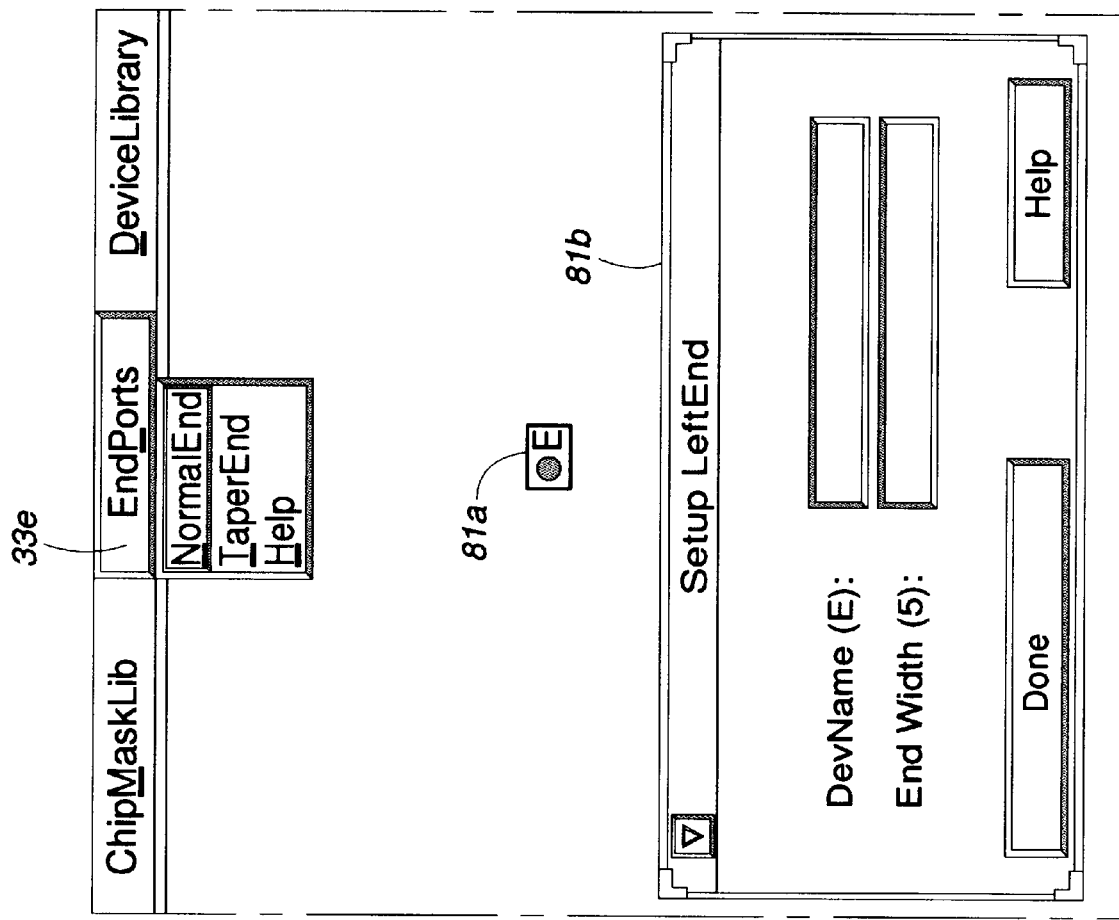
FIGS. 8(A) and (B) are views of display screens showing end port icons along with their local parameters.
Figure 8B:
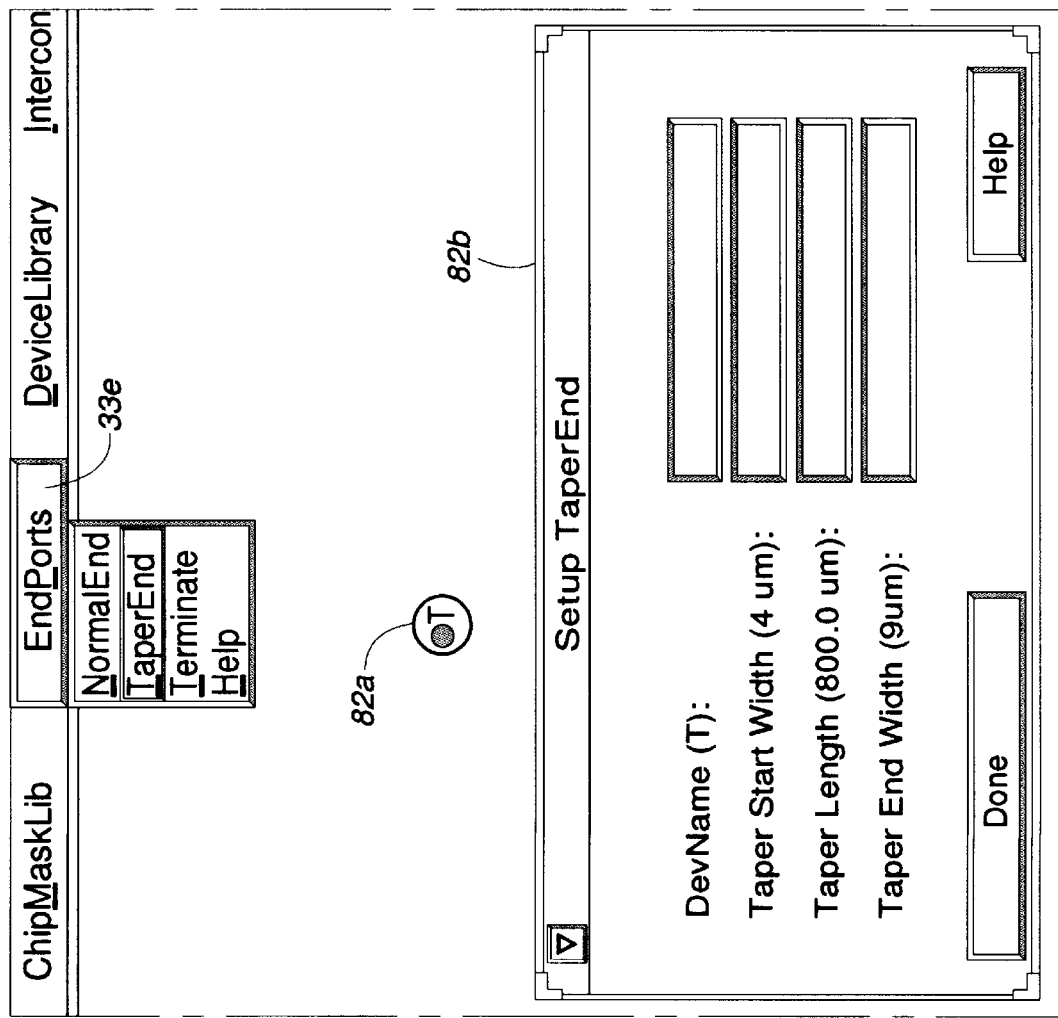

An end port is selected by placing the cursor on the desired end port and clicking the left mouse button. The icon for an end port is then positioned on the canvas by moving the cursor to a desired port of a device icon and double clicking the left mouse button. FIGS. 8(A) and 8(B) illustrate examples of icons 81a and 82a for the normal end and taper end ports, respectively.

III. Data Structure

Figure 9:
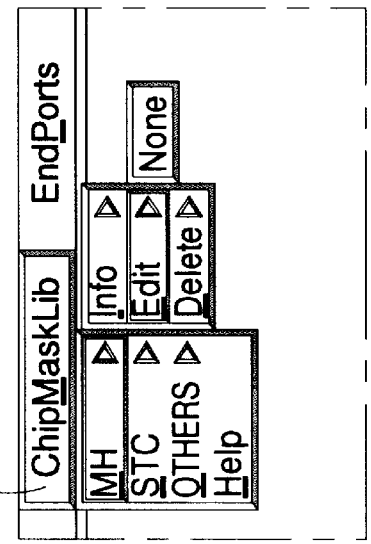
FIG. 9 is a view of a display screen showing a listing of available manufacturing standards under a "ChipMaskLib" heading.

The computer system 10 advantageously permits a user to design circuits which can be manufactured according to more than one manufacturing standard. As shown in FIG. 9, by selecting the heading "ChipMaskLib" 33d, the user is presented with an option to select an MH standard (Murray Hill), an STC standard, or other standards. Since the technologies for fabricating optical integrated circuits are still evolving, the computer system is able to evolve with the technology rather than be limited in time to a particular technology.

Each optical component, whether it is a device, interconnect, or end port, has a number of parameters that together define the characteristics of the component. The parameters have been divided into local parameters and common or global parameters. In general, the common parameters are shared by all components within one layout and, inter alia, define the manufacturing standard. The local parameters, in contrast, define the type of component, such as whether a component is a Mach-Zehnder interferometer or an Rfan interconnect, and also serve to distinguish between components of the same type, such as between two different Mach-Zehnder interferometers.

With reference to FIG. 10(A), the common parameters are displayed within a window 102 by selecting either "View" or "Modify" under the "CommonParam" heading 33a. The computer system presents the common parameters in a read-only access when the "View" option is selected and presents the common parameters in a read-write access when the "Modify" option is selected. In presenting the common parameters, the variables are listed along with their definition and default values.

The common parameters are stored in a global data file and are shown in their entirety below in Table 1. As shown in the table, the common parameters comprise a group of general design parameters and as well as parameters for each manufacturing standard. The general design parameters include such design criteria as the number of steps in digitizing a curve (Nsteps), the vertical waveguide separation (hfib), the mask level for the waveguide (levg), the mask level for the outline (levo), the mask level for the text (levt), and an index. The value of the index determines which manufacturing standard has been selected, with a value of zero being assigned to the STC standard, a value of 1 to a Murray Hill standard, and a value of 2 to a newly revised Murray Hill standard. The values for the parameters can be changed by placing the cursor on one of the parameters and using the Delete or Backspace keys to enter in the new values. While many of these parameters will likely remain unchanged, the number of steps in digitizing a curve (Nsteps) may be reduced to only 100 during initial layouts and then set to 4000 for the final layout. The meaning of these parameters will be apparent to those skilled in the art based on the definitions provided in Table 1.

TABLE 1

```
############################################
#       General designing parameters      #
############################################
0.125   -->  Litho grid size (um)
4000    -->  Nsteps in digitizing a curve
250     -->  hfib; vertical waveguide separation (um)
1.0     -->  scalex; scaling factor in x-direction
1.0     -->  scaley; scaling factor in y-direction
1       -->  levg; mask level of the waveguide
9       -->  levo; mask level of the outline
99      -->  levt; mask level of the text
1800    -->  length of saw marker at the end of chip
15000   -->  bend radius for Rfan connection (min=15000) (um)
2       -->  index;; set to different fabrication specifications
```

TABLE 1-continued

```
###### STC specifications (index = 0) ############
1.32     -->  lamda1; wavelength (um)
0.00389  -->  dn(lamda1); effective index difference from base
              cladding
262.0    -->  Lcp(lamda1,wcore); zero separation coupling length
              (um)
1.705    -->  d(lamda1); exponential coupling coefficient (um)
1.56     -->  lamda2; wavelength (um)
0.00295  -->  dn(lamda2); effective index difference from base
              cladding
283.0    -->  Lcp(lamda2,wcore); zero separation coupling length (um)
2.38     -->  d(lamda2); exponential coupling coefficient (um)
9.5      -->  CcSep; End-to-End separation (um)
5        -->  wcore; width of the core (um)
2.5      -->  under cut (um) (on layout)
4.5      -->  wafersize (inch)
2.5      -->  chip length (inch)
###### MH specifications index = 1 ############
1.32     -->  lamda1; wavelength (um)
0.00389  -->  dn(lamda1); effective index difference from base
              cladding
262.0    -->  Lcp(lamda1,wcore); zero separation coupling length (um)
1.705    -->  d(lamda1); exponential coupling coefficient (um)
1.56     -->  lamda2; wavelength (um)
0.00295  -->  dn(lamda2); effective index difference from base
              cladding
283.0    -->  Lcp(lamda2,wcore); zero separation coupling length (um)
2.38     -->  d(lamda2); exponential coupling coefficient (um)
10.5     -->  CcSep; End-to-End separation (um)
6        -->  wcore; width of the core (um)
0.5      -->  under cut (um) (on layout)
5.0      -->  wafersize (inch)
2.5      -->  chip length (inch)
###### index = 2 new parameters for MH ############
11       -->  number of entries for lam Lcoup Lends dn
#lamda    Lcoup     Lends     dn
1.200     5844.9    303.30    0.00577
1.250     4854.8    311.14    0.00561
1.300     4095.7    318.96    0.00546
1.350     3503.7    326.75    0.00530
1.400     3034.9    334.54    0.00514
1.450     2658.6    342.32    0.00499
1.500     2352.8    350.09    0.00484
1.550     2101.6    357.86    0.00469
1.600     1893.1    365.62    0.00454
1.650     1718.5    373.37    0.00439
1.700     1571.1    381.10    0.00425
9.0      -->   ccsep; center-center separation (um)
4.0      -->   wcore; width of the core (um)
0.5      -->   under cut (um) (on layout)
5.0      -->   wafersize (inch)
2.5      -->   chip length (inch)
###### End of global.dat ############
```

With regard to the local parameters, the local parameters may be recalled and displayed for any component by simply placing the cursor on the component and clicking on the right mouse button. The local parameters are shown in a window with the default values for the parameters being placed in parenthesis. Thus, the user can view the default values and selectively change the local parameters to suit the needs of a particular optical function.

With reference to FIGS. 4(A) to (G), the local parameters for the optical components are shown in addition to their icons. As shown by local parameter window 41b in FIG. 4(A), the straight waveguide includes a local parameter for the device name (DevName), a local parameter for the length of the wave guide (Lparall), and a parameter for the width of the waveguide (Wcore). For the straight waveguide, the default values set the length of the wave guide at 1,000 microns and the width of the core at 4 microns.

Figure 4B:
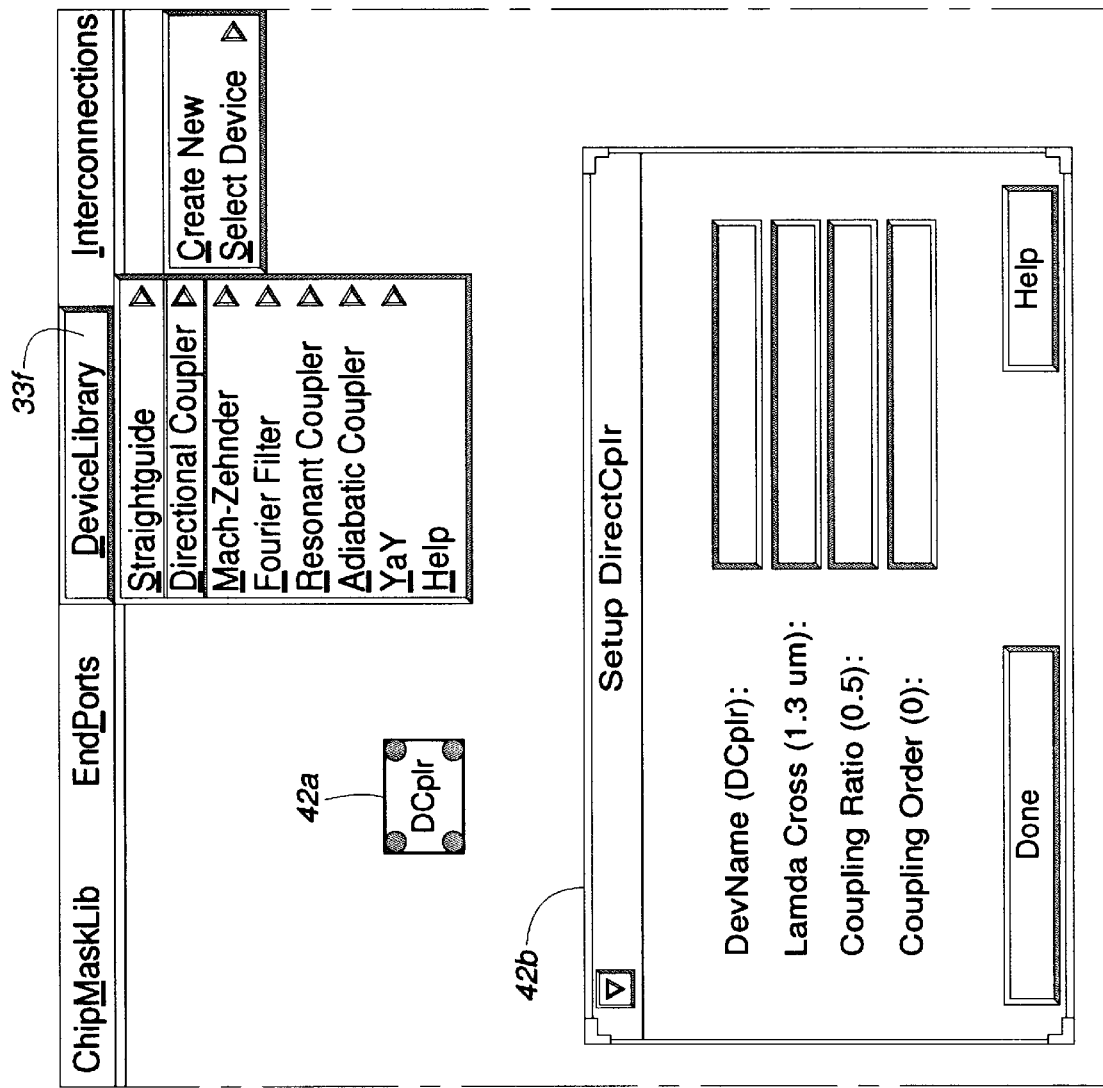

The directional coupler, as shown by the local parameter window 42b in FIG. 4(B), includes local parameters for the device name (DevName), the cross-over wavelength (Lamda Cross), the coupling ratio, and the coupling order.

Figure 4C:
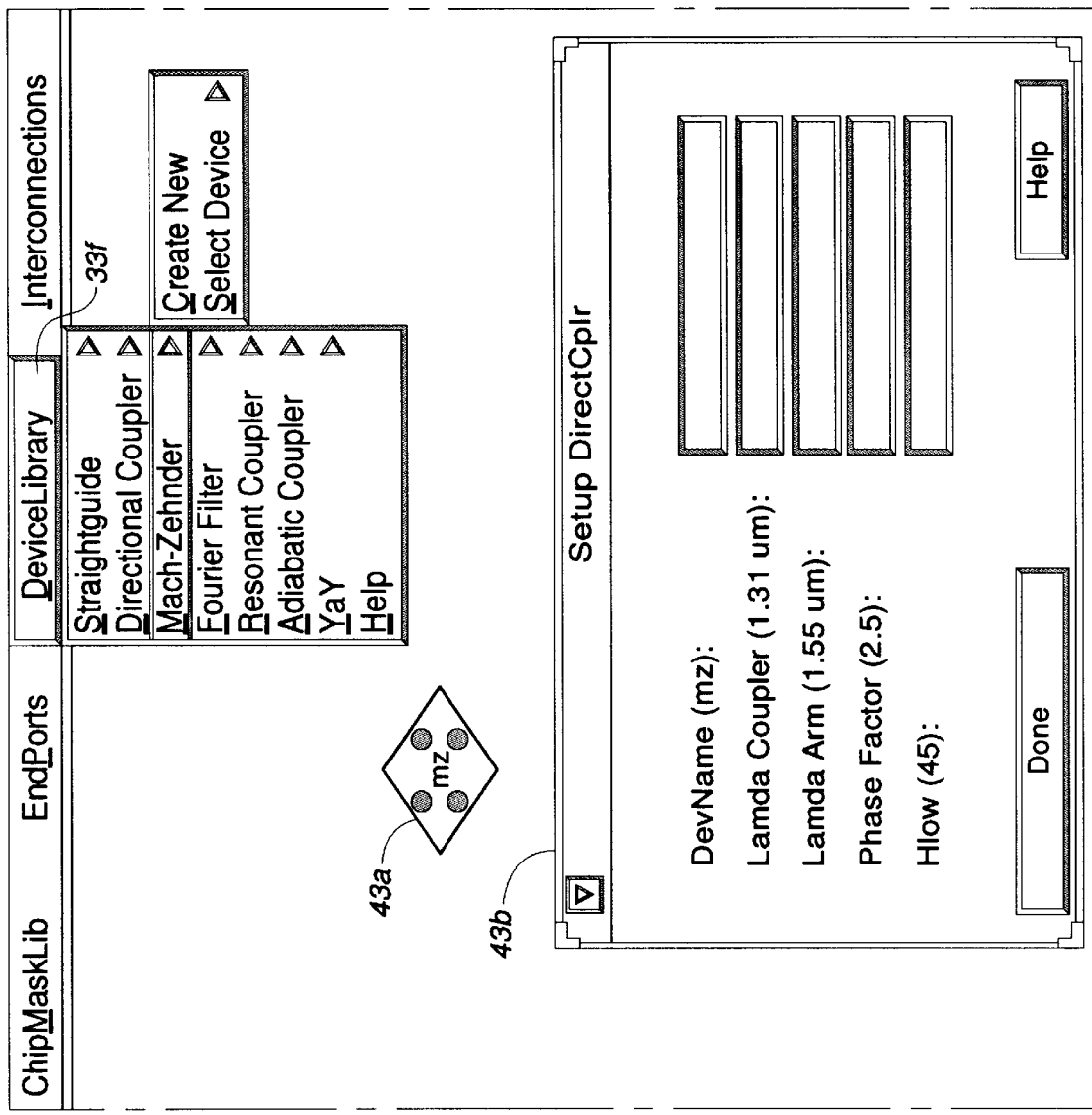

As shown by the local parameter window 43b in FIG. 4(C), the Mach-Zehnder includes local parameters for the device name (DevName), the coupling wavelength (Lamda Coupler), the wavelength for the arm of the interferometer (Lamda Arm), the phase factor, and a geometric parameter indicating the vertical separation between the center of the device and the lower arm in the interferometer (Hlow).

Figure 4D:
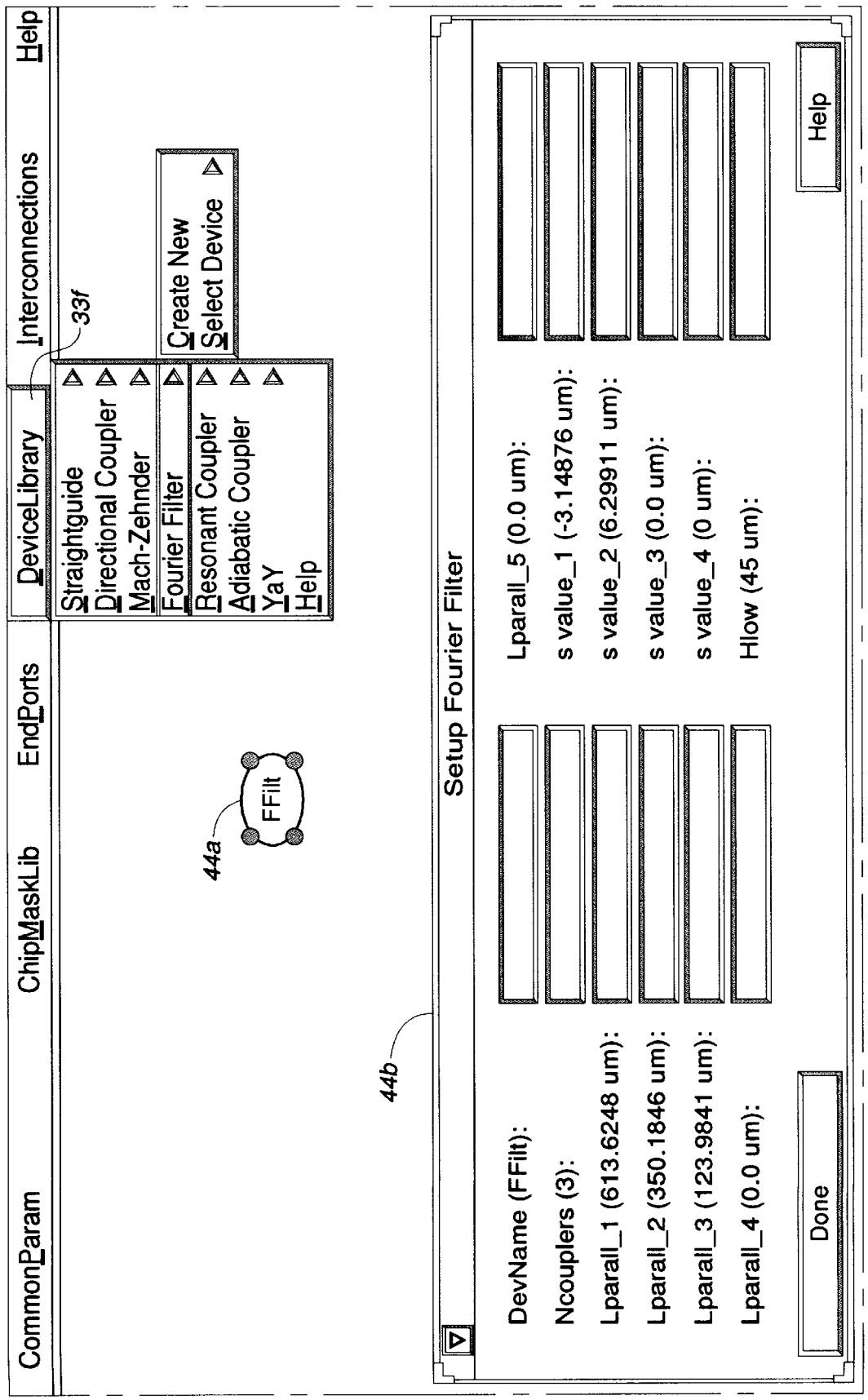

With reference to the local parameter window 44b FIG. 4(D), the fourier filter includes local parameters for the name of the device (DevName) and the number of couplers in the fourier filter (Ncouplers). The fourier filter can have a maximum of five directional couplers and has a default setting of three directional couplers. The local parameters also include variables for the length of the optical paths in each directional coupler, such as Lparall_1 for the first directional coupler, as well as variables for the values of phase difference between adjacent directional couplers, such as s value_1 for between the first and second directional couplers. As with the Mach-Zehnder, the fourier filter also includes a local parameter Hlow for setting the vertical separation between the two arms of the interferometer.

Figure 4E:
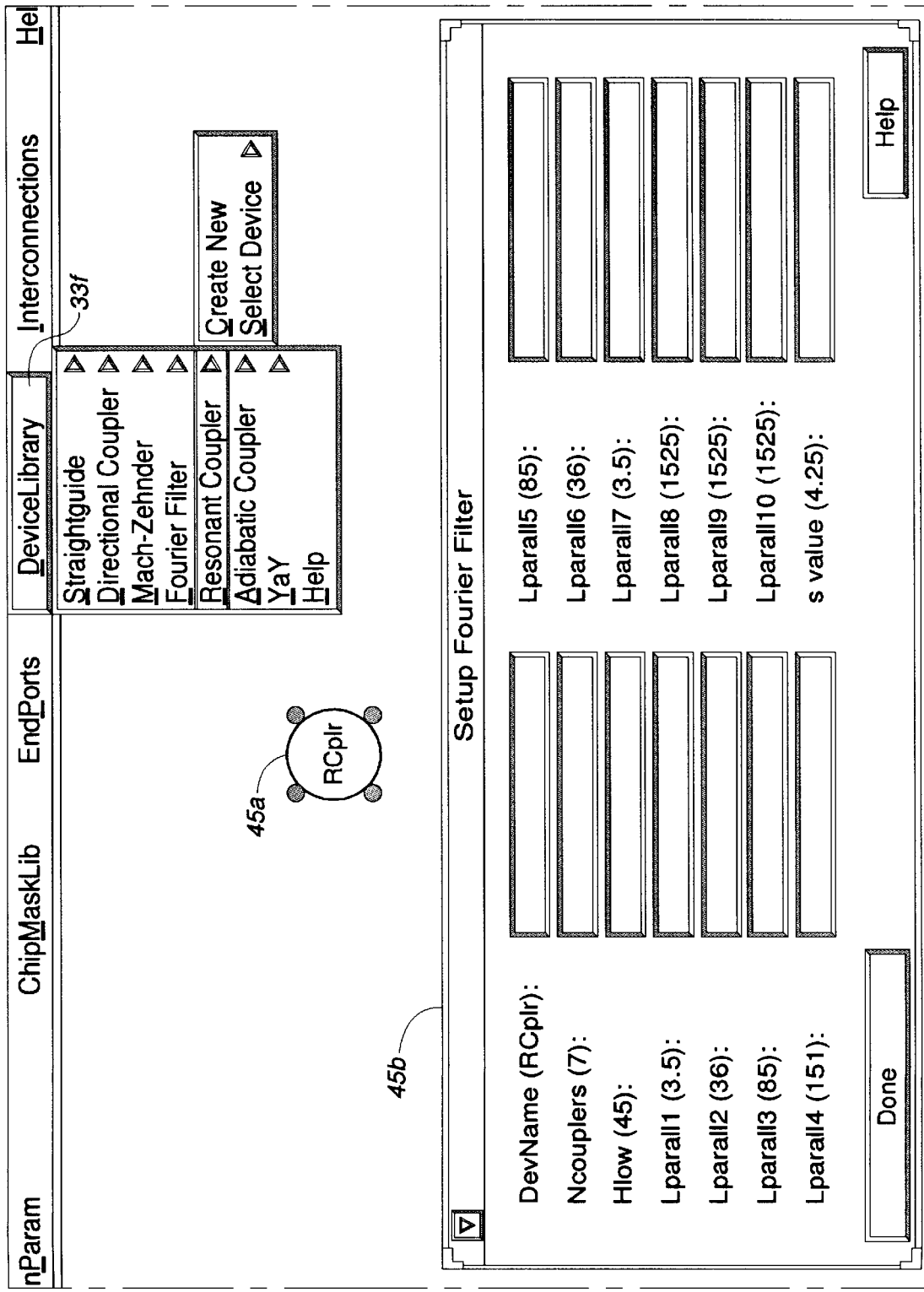

The local parameters for the resonant coupler, shown in the local parameter window 45b in FIG. 4(E), should be apparent from the previous local parameters in the other optical components. For the resonant coupler, however, the phase difference between adjacent directional couplers is constant, whereby the resonant coupler only has a single local parameter for the phase difference value, namely s value.

Figure 4F:
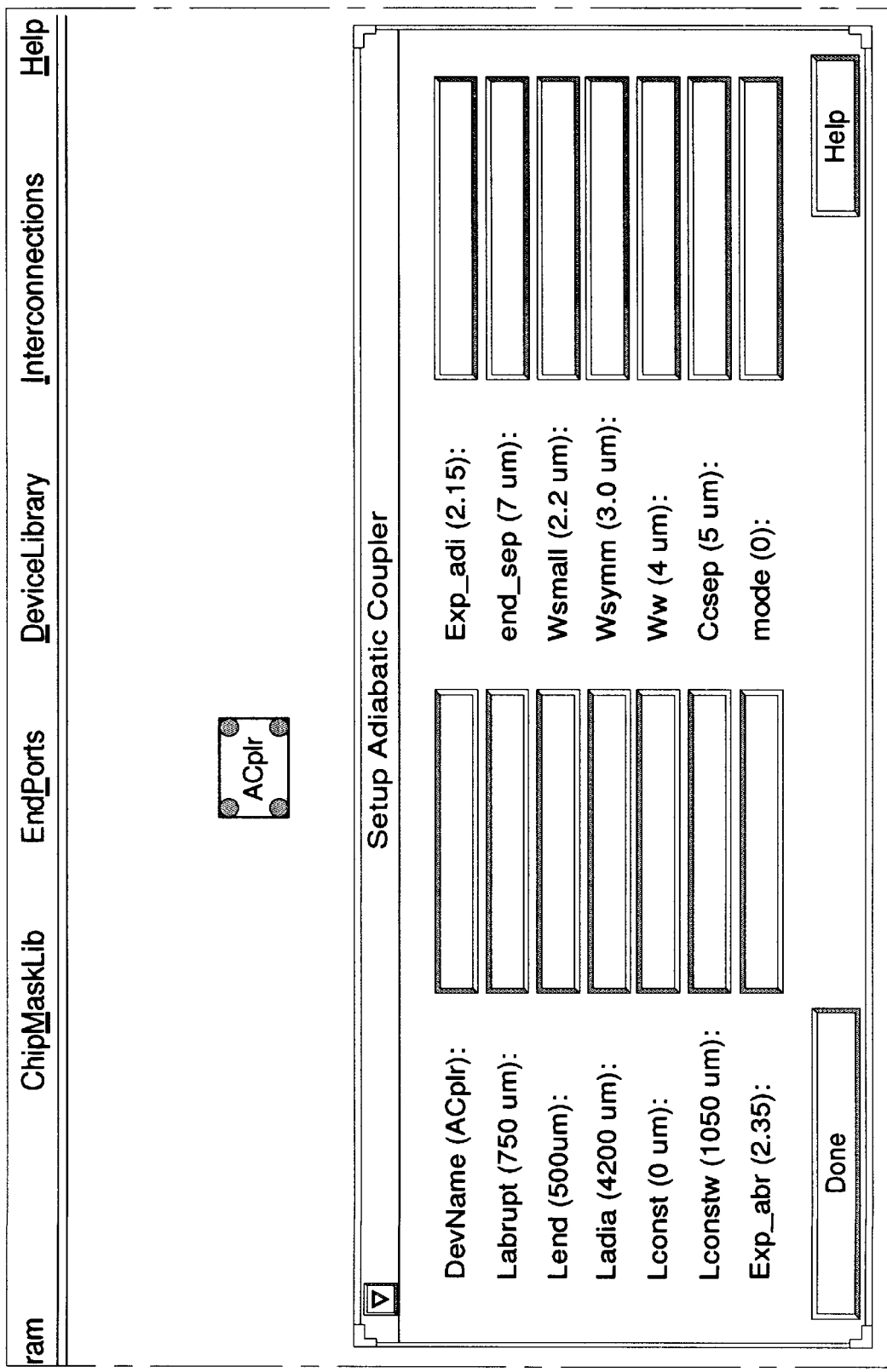

The local parameters for the adiabatic coupler, shown in the local parameter window 46b in FIG. 4(F), include parameters defining various lengths of the coupler ($L_{abrupt}$, $L_{end}$, $L_{adia}$, $L_{const}$, and $L_{constw}$, parameters defining power law curves for associated length sections (Exp_abr and Exp_adi), parameters defining various widths of the coupler ($W_{small}$, $W_{symm}$, and $W_w$), a center-to-center separation between waveguides (ccsep), and the mode, which is always set to zero for the adiabatic coupler.

Figure 4G:
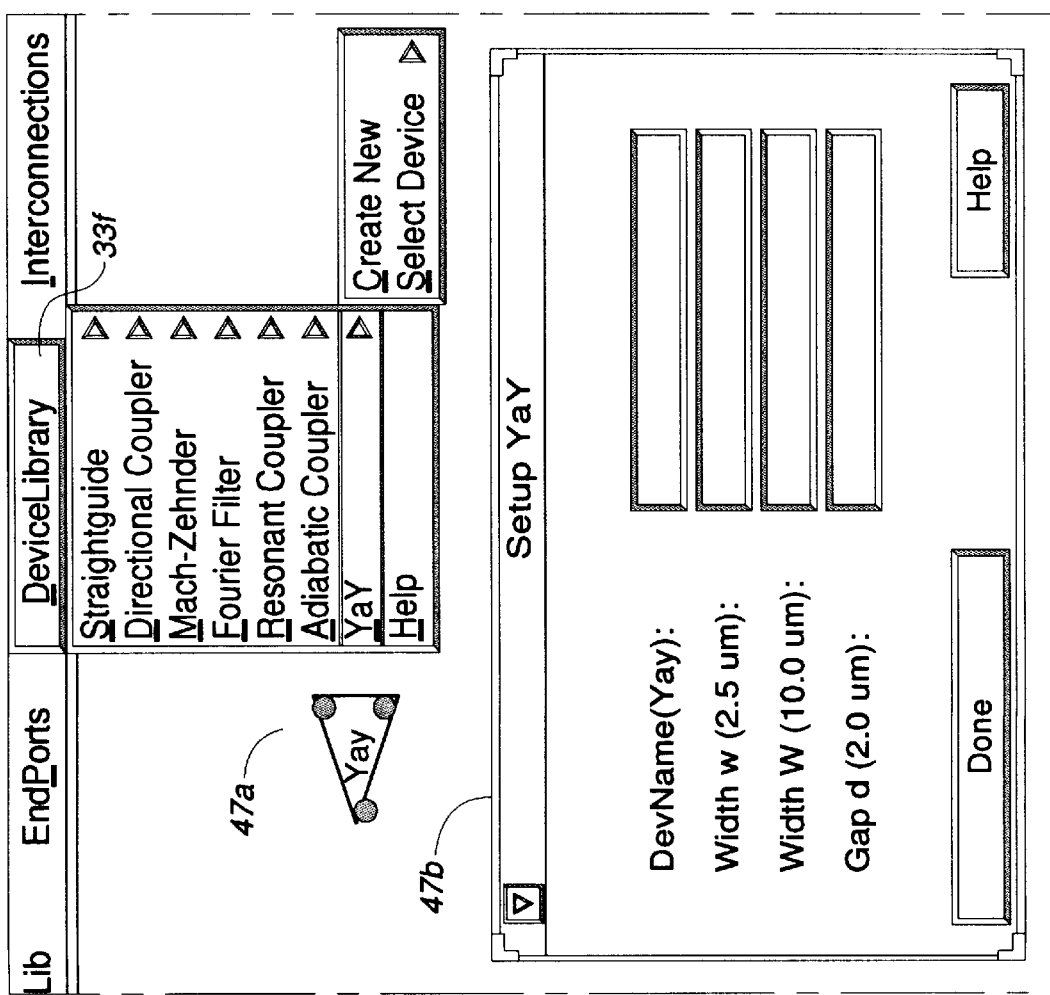

The local parameters for the Y-branch, shown in the local parameter window 47b in FIG. 4(G), include the device name, the width (w) of each of the two waveguide branches, the width (W) of the main waveguide, and the gap (d) between the two waveguide branches.

As shown in FIGS. 6(A) to 6(D), the local parameters for the various interconnects are shown along with their respective icons. For instance, as shown in local parameter window 61b in FIG. 6(A), the local parameters for the Rfan interconnect include the name of the interconnect (NetName), the name of the devices that the interconnect couples, the vertical separation between the devices (Hsep), and the amount in which the interconnect is offset relative to the devices (Dyoff). As shown in local parameter window 62b in FIG. 6(B), the local parameters for the SPJ interconnect are similar to those for the Rfan interconnect but also include a local parameter (Lsep) for setting the horizontal separation between the two devices. The Ujoin interconnect, as shown in local parameter window 63b in FIG. 6(C), has local parameters setting the width of the waveguide at each device as well as the radius of curvature. With reference to local parameter window 64b shown in FIG. 6(D), the taper join interconnect has local parameters specifying the width of the waveguide at each end of the interconnect as well as the length of the interconnect.

The local parameters for the end ports are shown in FIGS. 8(A) and 8(B) along with their respective icons. With reference to local parameter window 81b in FIG. 8(A), the normal end port includes local parameters for its device name (DevName) and the width at the end of the waveguide (End Width). The taper end port, as shown in local parameter window 82b in FIG. 8(B), also includes local parameters for the starting width, the length of the end port, and the ending width of the waveguide.

During the designing process of an optical integrated circuit, the computer system 10 generates a data array for each optical component in the circuit. For instance, the data array for an optical device would specify the number of the device, such as device number 1, and would also specify the device type, such as a directional coupler. The data array for the optical components further include all local parameters for the particular optical component and data describing the shape, color, and coordinates of the icon for that component.

More specifically, the memory of the computer system 10 includes the contents of data arrays Dev, Fan, NumDev, and NumFan. The variable Dev is used to track all device objects drawn on the canvas and includes information on the device type, device name, all local parameters associated with the device, the number of ports, as well as geometrical parameters, such as the coordinates, shape, and color of the device's icon. The variable Fan is used to manage the interconnects and includes information on the name of the interconnect, the type of interconnect, local parameters of the interconnection, the from and to devices for the interconnects, the from and to ports, as well as the geometrical parameters on the icon's color, shape, and coordinates. The variables NumDev and NumFan are used to count the total number of devices and interconnects, respectively.

Figure 10B:
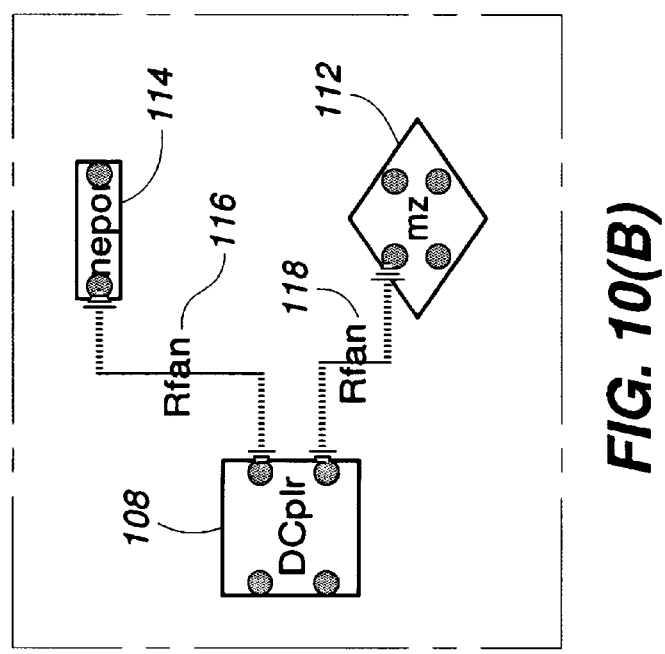
FIG. 10(B) is a view of a display screen with an exemplary optical circuit.

As an example, some of the representative data in the data arrays Dev, Fan, NumDev, and NumFan will be described with reference to the optical circuit shown in FIG. 10(B). As shown in the figure, this circuit is comprised of a directional coupler 108, a Mach-Zehnder 112, and a straight waveguide 114 and has two Rfan interconnects 116 and 118. Since the circuit has three optical devices and two interconnects, the variable NumDev has a value of 3 and the variable NumFan has a value of 2. The computer system 10 sets up data arrays Dev and Fan for each device and interconnect, respectively. For instance, a first device data array would be Dev(1, name)="Dcplr"; Dev(1,type)=directional coupler; . . . etc., a second device data array would be Dev(2,name)="one"; Dev(2,type)=straight waveguide; . . . etc., and the third device data array would be Dev(3,name)="MZ"; Dev(3, type)=Mach-Zehnder; . . . , etc. A first interconnect data array would be Fan(1,name)="Rfan"; Fan(1,type)=Rfan; Fan(1,FrDev)="Dcplr"; Fan(1,ToDev)="one"; Fan(1, FrPort)=3, Fan(1,ToPort)=1; . . . etc. and a second interconnect data array would be Fan(2,name)="Rfan"; Fan(2,type)= Rfan; Fan(2,FrDev)="Dcplr"; Fan(2,ToDev)="MZ"; Fan(2, FrPort)=4, Fan(1,ToPort)=1; . . . etc. It should be understood that the information on the various devices, interconnects, and end ports need not be contained in data arrays may be maintained in other ways which are apparent to those skilled in the art.

IV. Spectral Analysis

Figure 11A:
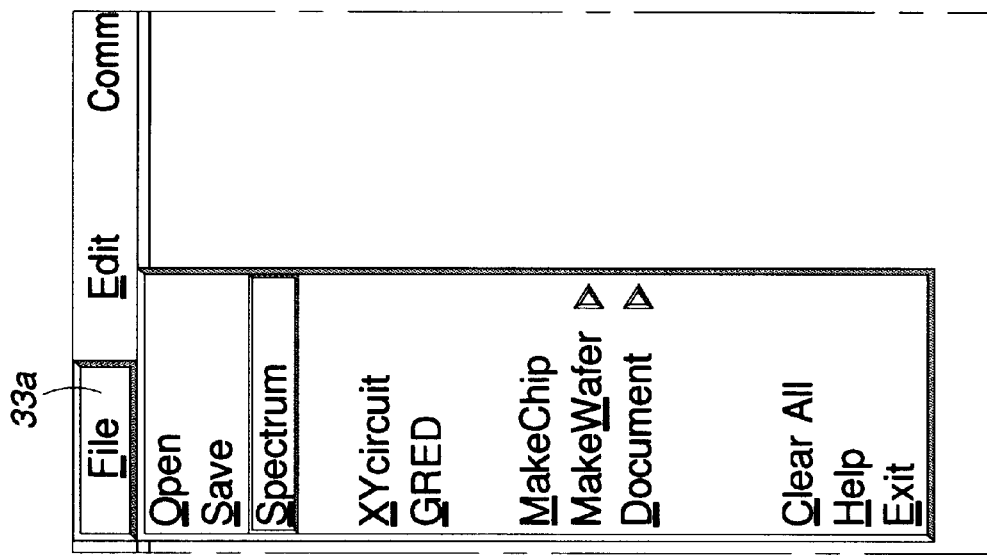
FIG. 11(A) is a view of a display screen showing a "Spectrum" option under a "File" heading.
Figure 11B:
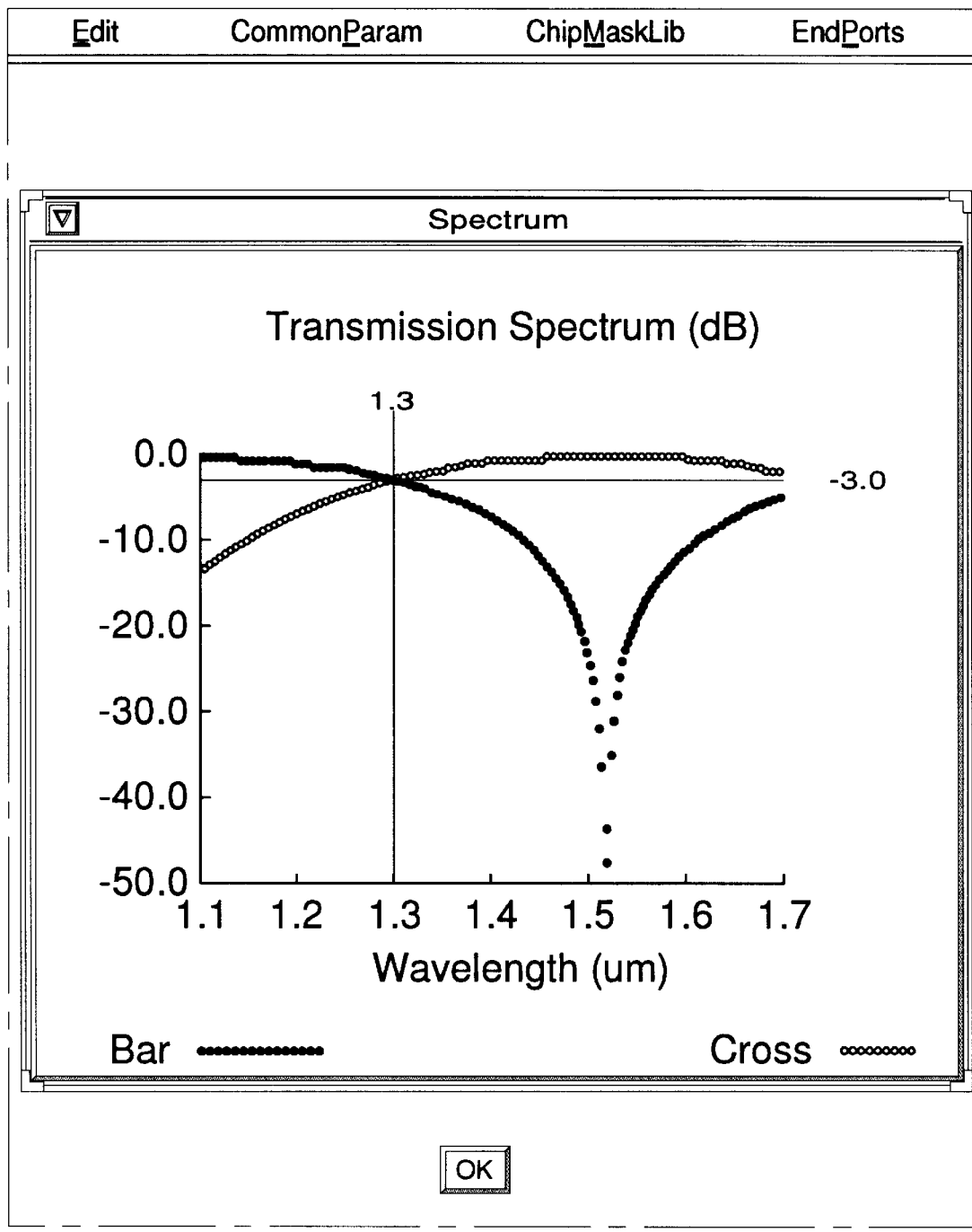
FIG. 11(B) is a view of a display screen showing a spectral analysis of a directional coupler.

At anytime during the design of an optical integrated circuit, the user can select the "Spectrum" option under the "File" heading 33a, as shown in FIG. 11(A), in order to receive a spectral analysis of a desired optical path within an optical circuit. In the example shown in FIG. 11(B), the spectral analysis was performed on a directional coupler. The spectral analysis provides a transmission spectrum of power versus wavelength through a user defined optical path in an optical circuit. This spectral analysis is calculated analytically by multiplying the transfer matrix of each device along the optical path. As shown in FIG. 11(B), the computer system 10 displays the results of the analysis in the form of a graph.

To perform a spectral analysis, the "Spectrum" is selected with the left mouse button and the beginning of an optical path is defined by placing the cursor on a desired port of an input device and clicking a single time on the left mouse button. Next, the user positions the cursor on each icon along a desired optical path and clicks the left mouse button for each of these icons. After the user presses the "Esc" key, the computer system 10 will automatically perform a spectral analysis and display the results on the display.

While the determination of transfer matrices for the various optical components can be determined by those skilled in the art, a spectral analysis of an optical circuit having a directional coupler will be described to provide an example of the spectral analysis performed by the computer system 10. Based on this example, the calculations necessary to perform the spectral analysis on other circuits will be apparent to those skilled in the art and, accordingly, have been omitted.

The transfer matrices for the various optical components are known to those skilled in the art and may be found in the textbook entitled "Integrated Optics: Design and Modeling" by Reinhard Marz, 1995. For instance, the transfer matrix for a directional coupler is defined according to the following equation:

$$\tilde{u} = \begin{pmatrix} \cos\varphi i \sin\varphi \\ -i\sin\varphi \cos\varphi \end{pmatrix}. \tag{EQ. 1}$$

The computer system 10 determines the values for $\phi$ based on the local parameters of a particular directional coupler.

As shown above in Table 1, the common parameters for each manufacturing standard include empirically measured values for the effective index difference from the base cladding (dn), the zero separation coupling length (Lcp), and the exponential coupling coefficient (D) for at least two different wavelengths. Based on these empirically determined values, the exponential coupling coefficient (D) for any particular wavelength is calculated from the known values by linear interpolation according to the following equation:

$$D = D(\lambda_1) + \frac{D(\lambda_2) - D(\lambda_1)}{\lambda_2 - \lambda_1}(\lambda - \lambda_1). \tag{EQ. 2}$$

The coupling length ($L_c$) for a particular wavelength is also calculated by linear interpolation based on the empirically determined values found in the common parameters. The coupling length ($L_c$) is calculated according to the following equation:

$$L_c = L_c(\lambda_1) + \frac{L_c(\lambda_2) - L_c(\lambda_1)}{\lambda_2 - \lambda_1}(\lambda - \lambda_1). \tag{EQ. 3}$$

The separation (sep) between the waveguides is next determined according to the following equation:

$$sep = ccsep - wcore \tag{EQ. 4}$$

Based on the separation (sep) and the exponential coupling coefficient D, the zero separation coupling length ($L_{cp}$) is determined according to the following equation:

$$L_{cp} = L_c \exp\left(\frac{sep}{D}\right). \tag{EQ. 5}$$

(EQ. 5).

Before the value of $\phi$ may be derived, the value ($L_{end}$) of the separation at either end of the directional coupler must be determined according to the following equation:

$$L_{end} = \sqrt{\pi(D)\text{rad}}. \tag{EQ. 6}$$

(EQ. 6).

Once the zero separation coupling length ($L_{cp}$) and the length of the ends ($L_{end}$) is determined, the value of $\phi$ may be calculated factoring in the length of the parallel portions ($L_{parallel}$), which are determined based on the user defined local parameters for the directional coupler. The value of $\phi$ is calculated using the following equation:

$$\varphi = \frac{\pi}{2L_{cp}}(L_1 + L_{end}). \tag{EQ. 7}$$

(EQ. 7).

The value of $\phi$ is then substituted back into Equation 1 for the particular wavelength in order to determine the amount of power transmitted through the directional coupler for that wavelength. The computer system 10 repeats these calculations for a number of wavelengths within a range so as to provide the spectral analysis.

To perform a spectral analysis on other optical circuits, such as circuits having other optical components, the transfer matrices are determined for each optical component along the user-defined optical path in a manner similar to that described above for the directional coupler. Once all of the transfer matrices have been determined, the computer system 10 next performs matrix calculations to derive the transmission spectrum for the user-defined optical path. For the purposes of these determinations, the interconnects are considered to be loss-less transmission lines.

V. Circuit Design and Layout Example

Figure 12:
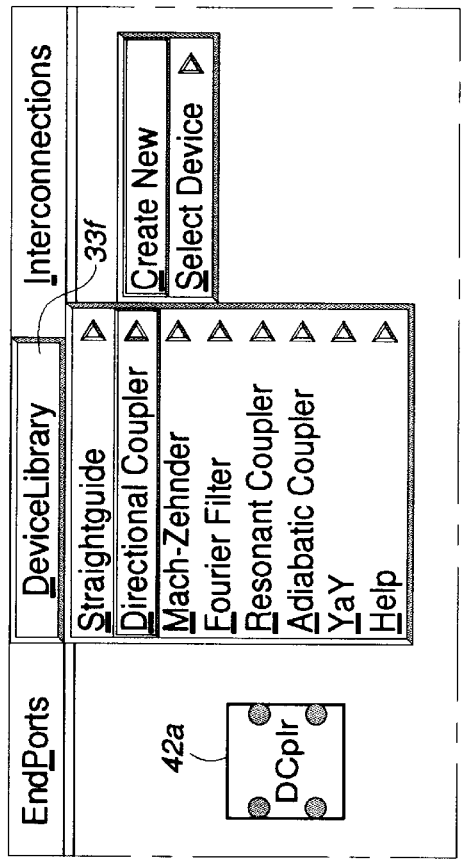
FIG. 12 is a view of a display screen illustrating the introduction of a new directional coupler to the canvas.

The design of an optical circuit will now be described in order to provide an illustration as to how the computer system 10 according to the invention can easily design and layout an application specific optical integrated circuit. As shown in FIG. 12, by going to the "DeviceLibrary" heading 33f and selecting the "Create New" option under the "Directional Coupler" subheading, the icon 42a for a directional coupler can be positioned on the empty canvas 34. To modify or view the local parameters of the directional coupler, the user clicks on the icon 42a for the directional coupler with the right mouse button. In response to this action, the menu 42b of the local parameters for the directional coupler is displayed and the default values are shown in parentheses next to the parameter names. In this example, the default values for the directional coupler's local parameters are a −3 dB coupler for light at 1.3 micrometer and has a zero value coupling order in order to provide the shortest coupler with the desired characteristics.

In order to view the spectrum of the directional coupler, the user goes under the "File" heading and selects "Spectrum." By clicking on one of the input ports, the body of the icon 42a, and then hitting "Esc," the spectrum corresponding to both output ports of the directional coupler will be displayed along with horizontal and vertical marker lines, as shown in FIG. 11(B). These marker lines may be moved by selecting them with the left mouse button, moving them to a desired value, and then releasing the button. The spectrum is determined by the analytical formula expressing coupling according to the user specified parameters.

Figure 13B:
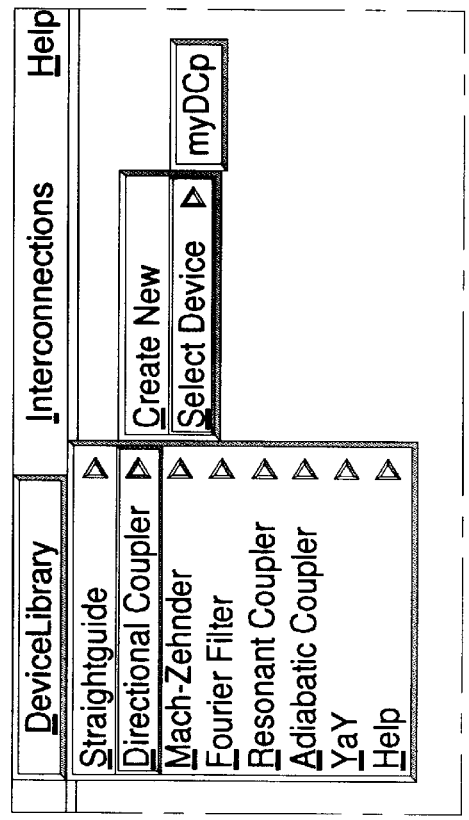
FIG. 13(B) is a view of a display screen illustrating the retrieval of a saved directional coupler.
Figure 13A:
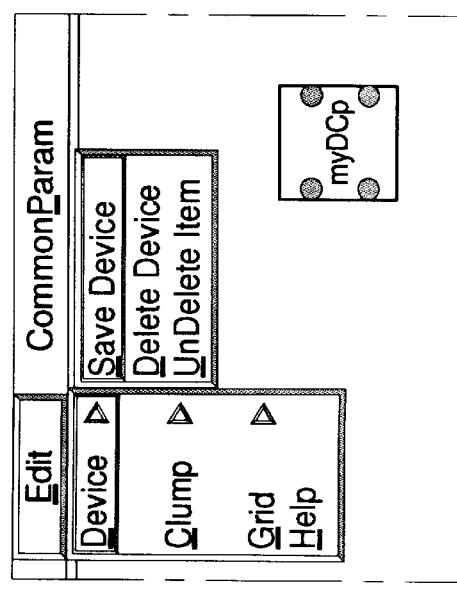
FIG. 13(A) is a view of a display screen illustrating the saving of a directional coupler.

The data array for this particular directional coupler can be saved and retrieved in subsequent circuits. To save the directional coupler, the user selects the "Edit" heading 33b and selects the "Save Device" option, as shown in FIG. 13(A). The directional coupler can then be saved by double clicking on its icon 42a with the left mouse button. If the user later chooses the "Select Device" option under the "Directional Coupler" sub-heading in the "Device Library" heading 33f, the saved directional coupler "myDCp" will be listed as a directional coupler that can be retrieved in a new circuit, as shown in FIG. 13(B). Rather than saving the device, the directional coupler on the canvas can be deleted by simply going to the "Edit" heading 33b, selecting the "Delete Device" sub-heading, and then double clicking on the directional coupler's icon 42a with the left mouse button.

Additional optical devices may be added to the canvas by selecting the "Device Library" heading 33f and choosing the desired optical devices. For instance, as shown in FIG. 14(A), a single Mach-Zehnder and three straight waveguides have been added to the canvas along with the directional coupler.

Figure 14B:
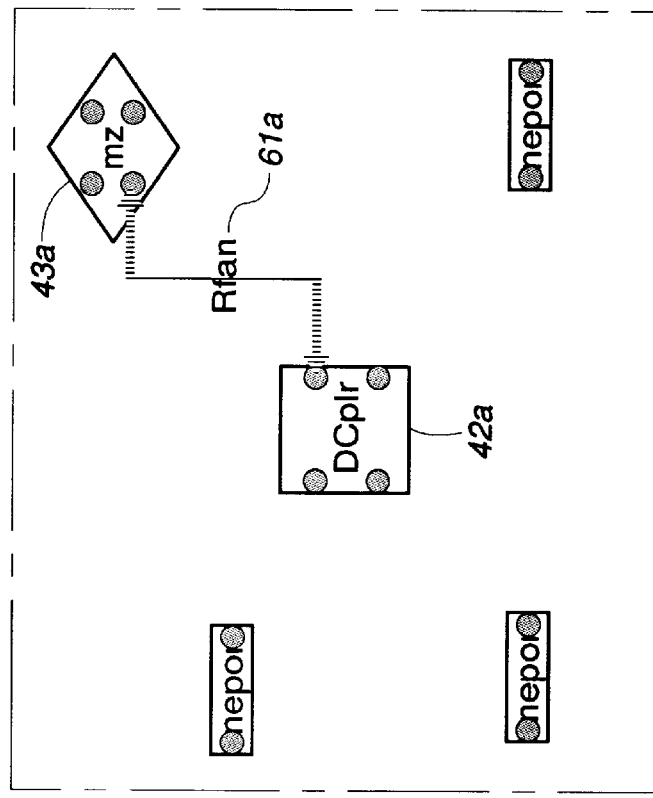
FIGS. 14(A) to 14(H) are views of display screens depicting a process by which an optical circuit can be designed, analyzed, and laid out.
Figure 14A:
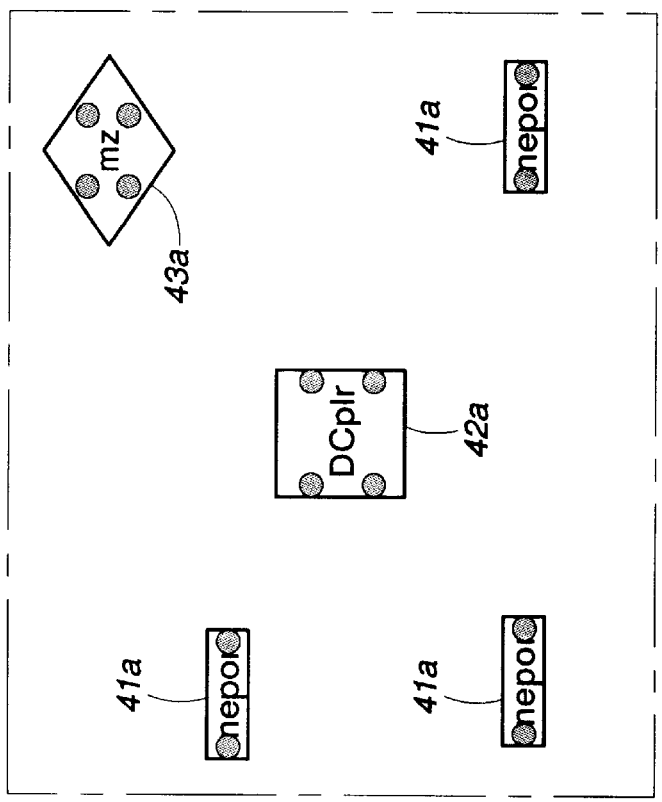

The optical devices shown in FIG. 14(A) are next coupled together by selecting one of the interconnects in the "Interconnections" library. For instance, as shown in FIG. 14(B), after selecting Rfan from the "Interconnections" heading 33g, the Rfan interconnect icon 61a may be added to the canvas by double clicking on the output port of the directional coupler's icon 42a and then an input port of the Mach-Zehnder's icon 43a. As a result of this action, an interconnection line 61a with the label "Rfan" will be shown connecting the directional coupler to the Mach-Zehnder.

Figure 14C:
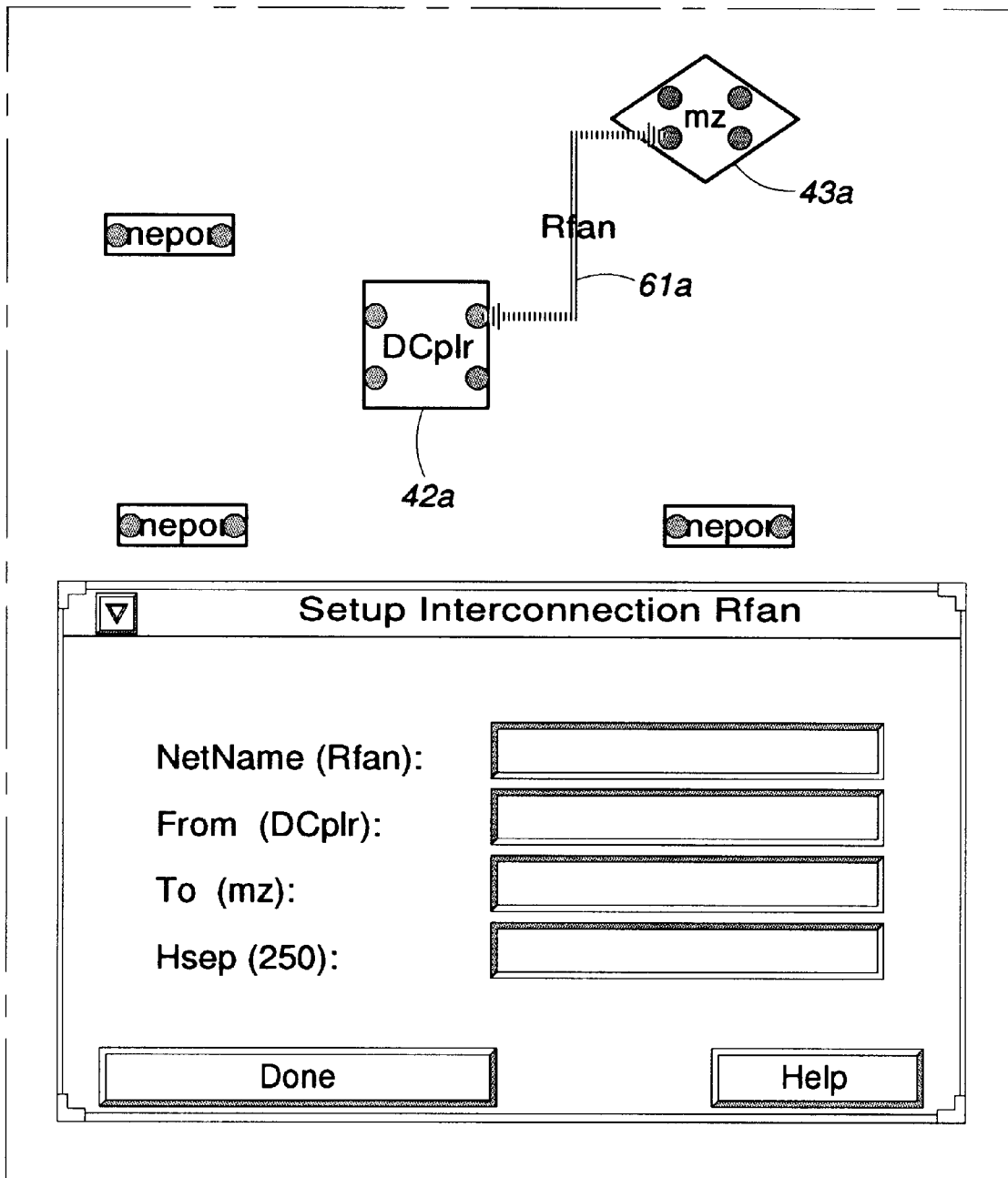

To view the local parameters of an interconnect, the user places the cursor on a selected interconnect, such as the Rfan icon 61a connecting the directional coupler to the Mach-Zehnder, and then clicks the right mouse button. As shown in FIG. 14(C), a menu 61b of the local parameters for the selected interconnect will be displayed in a menu window. As shown in the menu 61b, the local parameters indicate that the Rfan interconnect is defined from the directional coupler to the Mach-Zehnder and has a vertical separation (Hsep) of 250 microns.

Figure 14D:
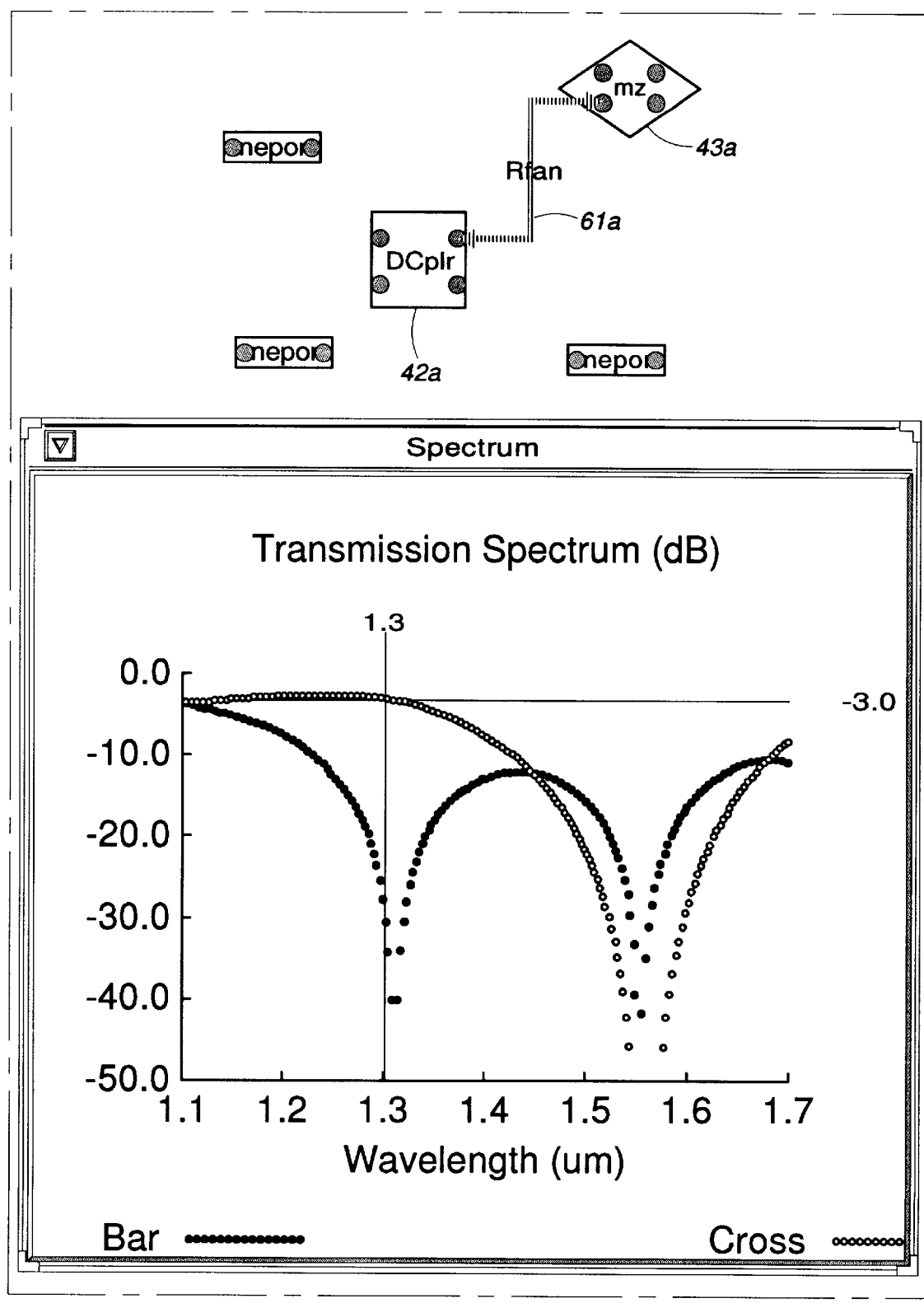
Figure 14F:
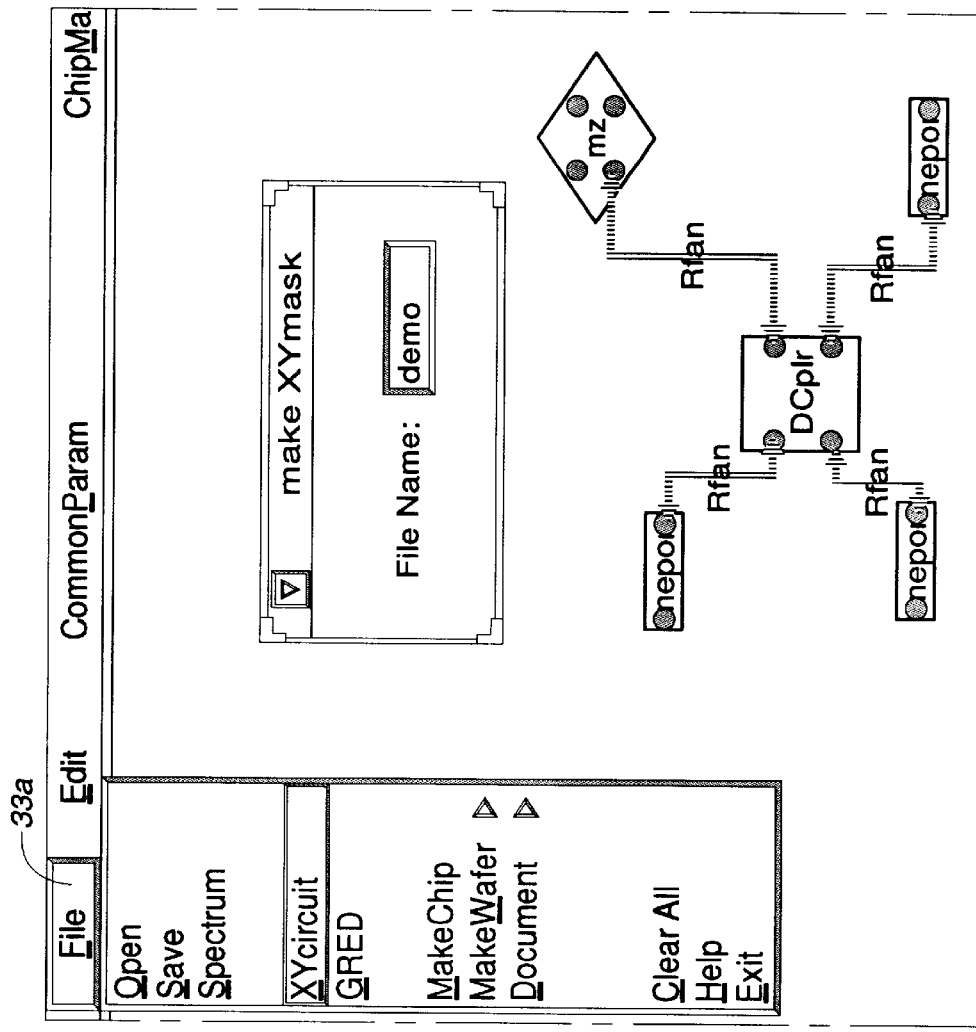
Figure 14E:
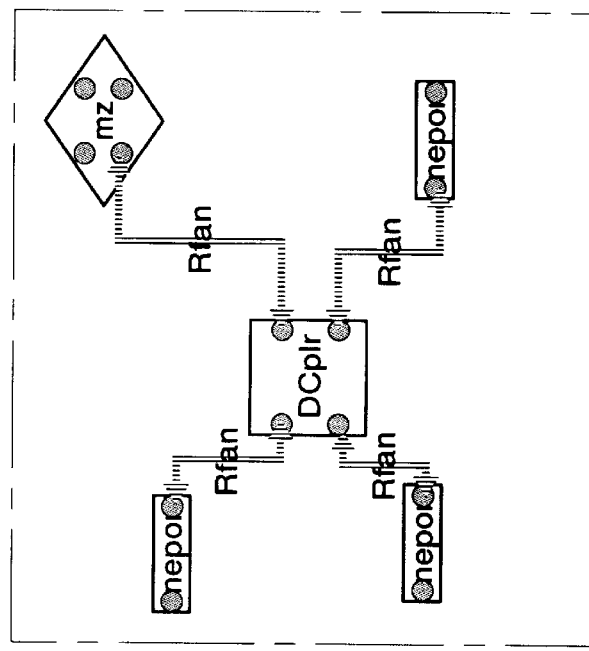

At any time during the design process, the user may select the "Spectrum" option under the "File" heading 33a and receive a spectral analysis of a user-defined optical path in the optical circuit. For instance, as shown in FIG. 14(D), a spectral analysis for the optical path defined from the directional coupler to the Mach-Zehnder may be viewed by clicking on an input port of the directional coupler icon 42a, clicking on the Mach-Zehnder icon 43a, and then pressing the "Esc" key. As shown in the figure, the transmission spectrum is provided for both output ports of the Mach-Zehnder. In a suitable manner, the directional coupler can be connected to the three straight waveguides with the "Rfan" interconnect, as shown in FIG. 14(E).

It should be understood that other optical circuits having other optical devices and other interconnects may be easily designed with the computer system 10. Further, the computer system 10 provides a quick and accurate spectral analysis whereby the user can verify the results of a circuit during the design process of the circuit. The computer system 10 therefore overcomes one of the major problems in the prior art, namely, that the optical circuit designer would have to write and debug a dedicated program for a particular circuit in order to determine the spectral analysis of that circuit. With the invention, the user need only select the "Spectrum" sub-heading and define the optical path in the circuit.

The invention also overcomes another major problem in the prior art, namely, the problem of visually confirming the layout of an optical circuit. With the invention, a mask layout for the circuit may be produced by first selecting the "XYcircuit" option under the "File" heading 33a. The computer system 10 will next prompt the user for a file name to be assigned to the xy mask, as shown in FIG. 14(F). A mask layout driver, which will be described in more detail below, generates a .x data file which corresponds to a mask layout of the desired circuit. For instance, for the optical circuit designed in FIG. 14(E), the mask layout driver will produce a .x file which defines the optical paths for all devices, interconnects, and end ports in the optical circuit.

Figure 14G:
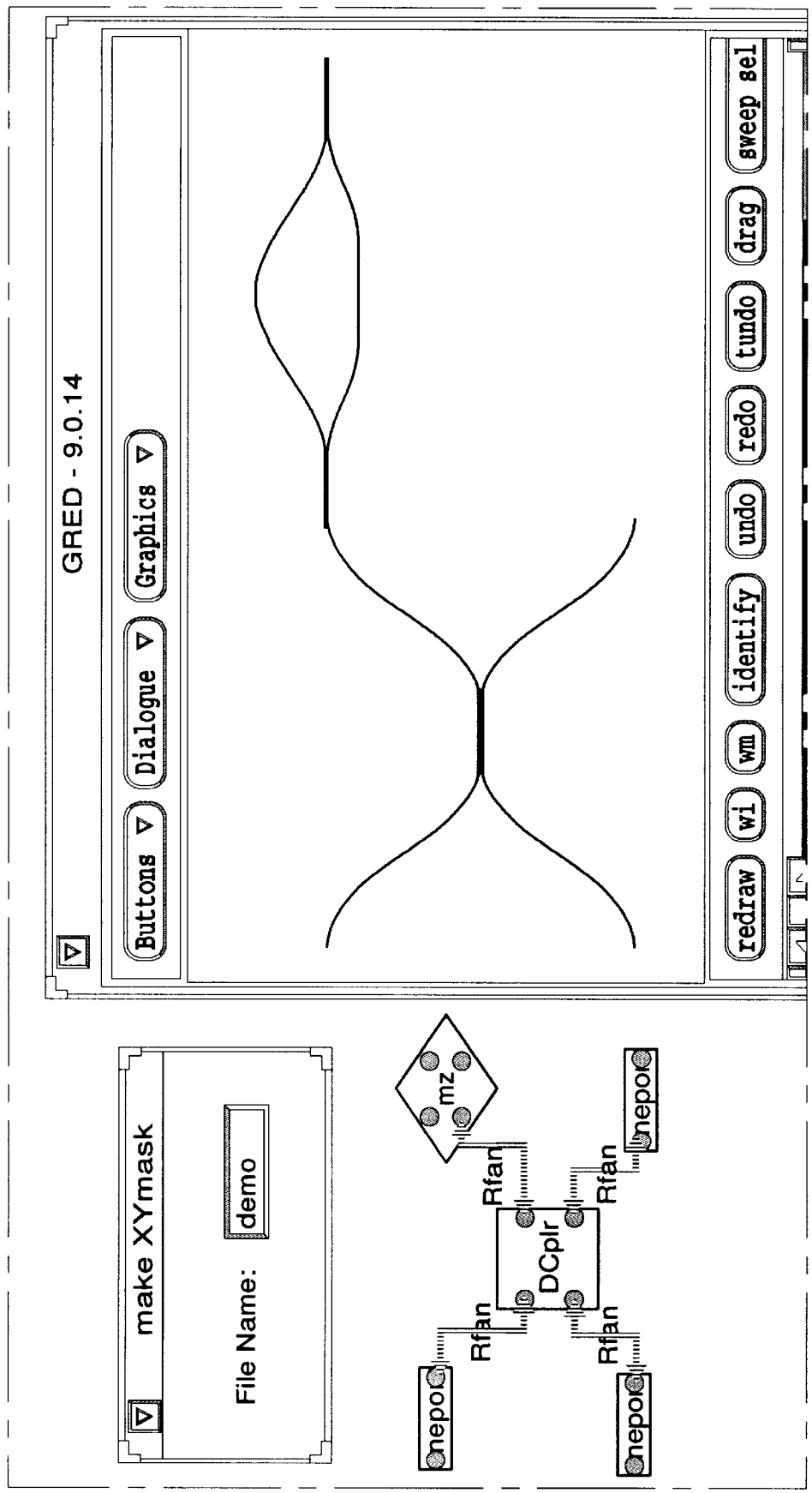
Figure 14H:
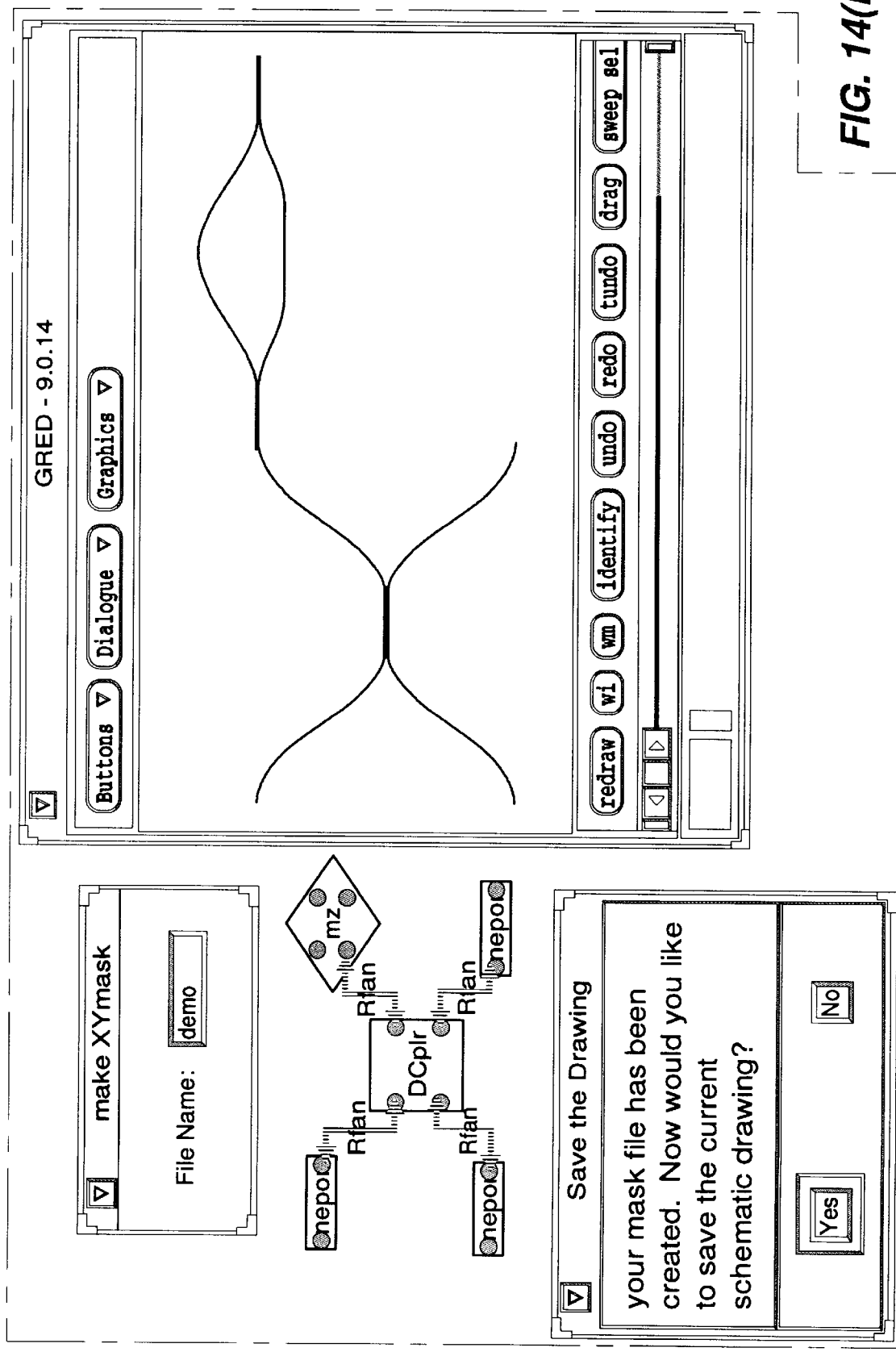

To view the optical circuit, the user selects the "GRED" option under the "File" heading 33a and enters the file name in the .x format. As shown in FIG. 14(G), a mask layout showing the optical circuit of FIG. 14(E) is displayed. In this manner, the user can receive a quick and easy visual verification of the design of an optical circuit. After the mask layout has been generated, with reference to FIG. 14(H), the user is given the option of saving the visual drawing of the circuit.

The "GRED" program is a graphical editor program developed by AT&T. The invention is not limited to this particular graphical editor but may be used with other suitable graphical editors, such as other Auto-CAD tools. One advantage of "GRED," however, is that the view across the width of the optical circuit can be magnified relative to the view along the length of the circuit. Since optical circuits have a length which is typically much longer than its width, the "GRED" program can expand the width of the optical circuit so that the entire circuit may be more easily viewed.

Figure 15A:
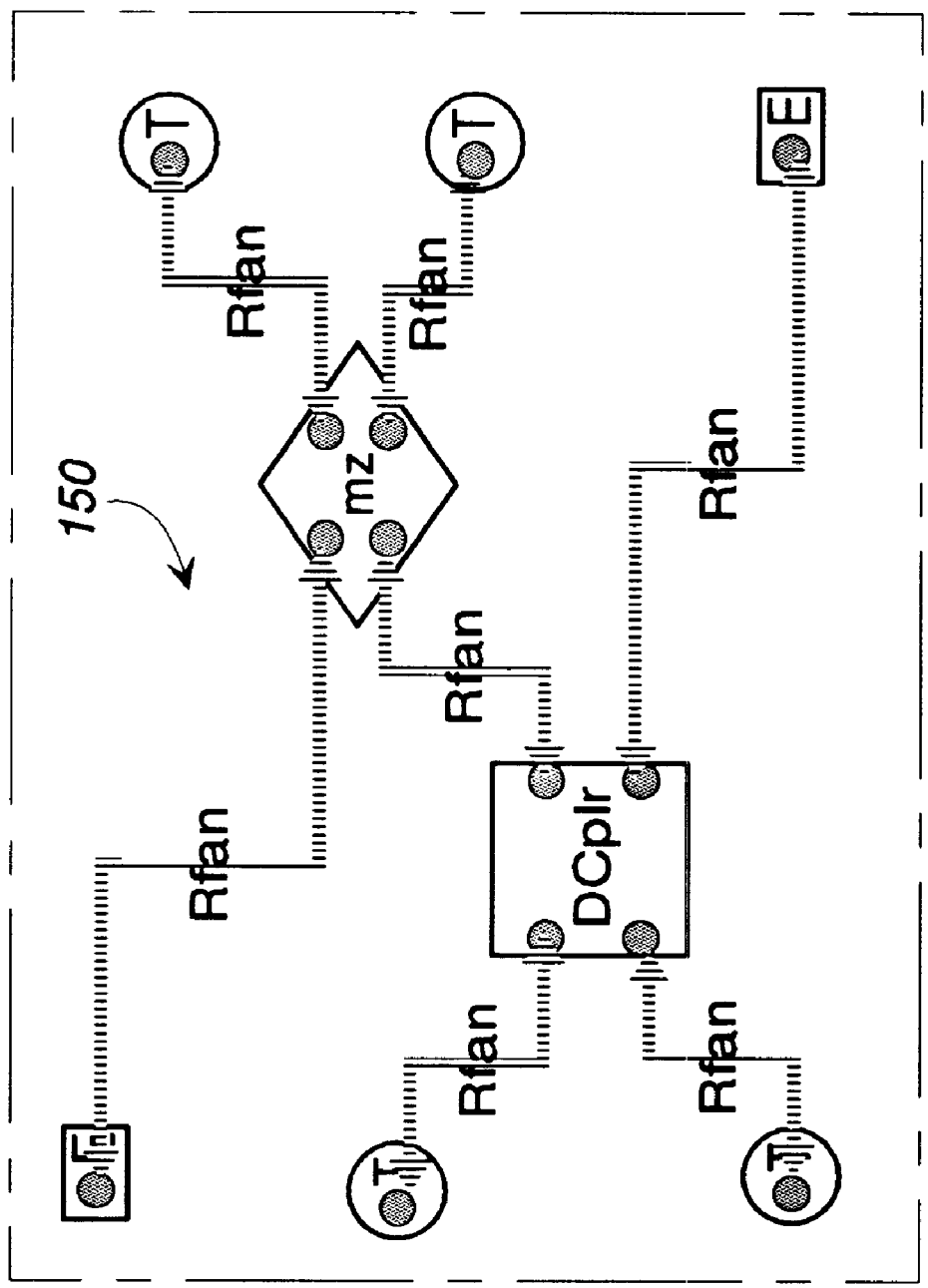
FIGS. 15(A) to 15(G) are view of display screens depicting a process by which an integrated chip can be designed and laid out.

After a desired optical circuit has been designed, the computer system 10 according to the invention can also be used to design an optical chip incorporating a desired circuit or circuits. With reference to FIG. 15(A), an optical circuit 150 has been designed with a directional coupler, a Mach-Zehnder, and six different end ports. The optical circuit 150 in FIG. 15(A) is similar to that shown in FIG. 14(E) except that the straight waveguides have been replaced by the end ports.

Figure 15B:
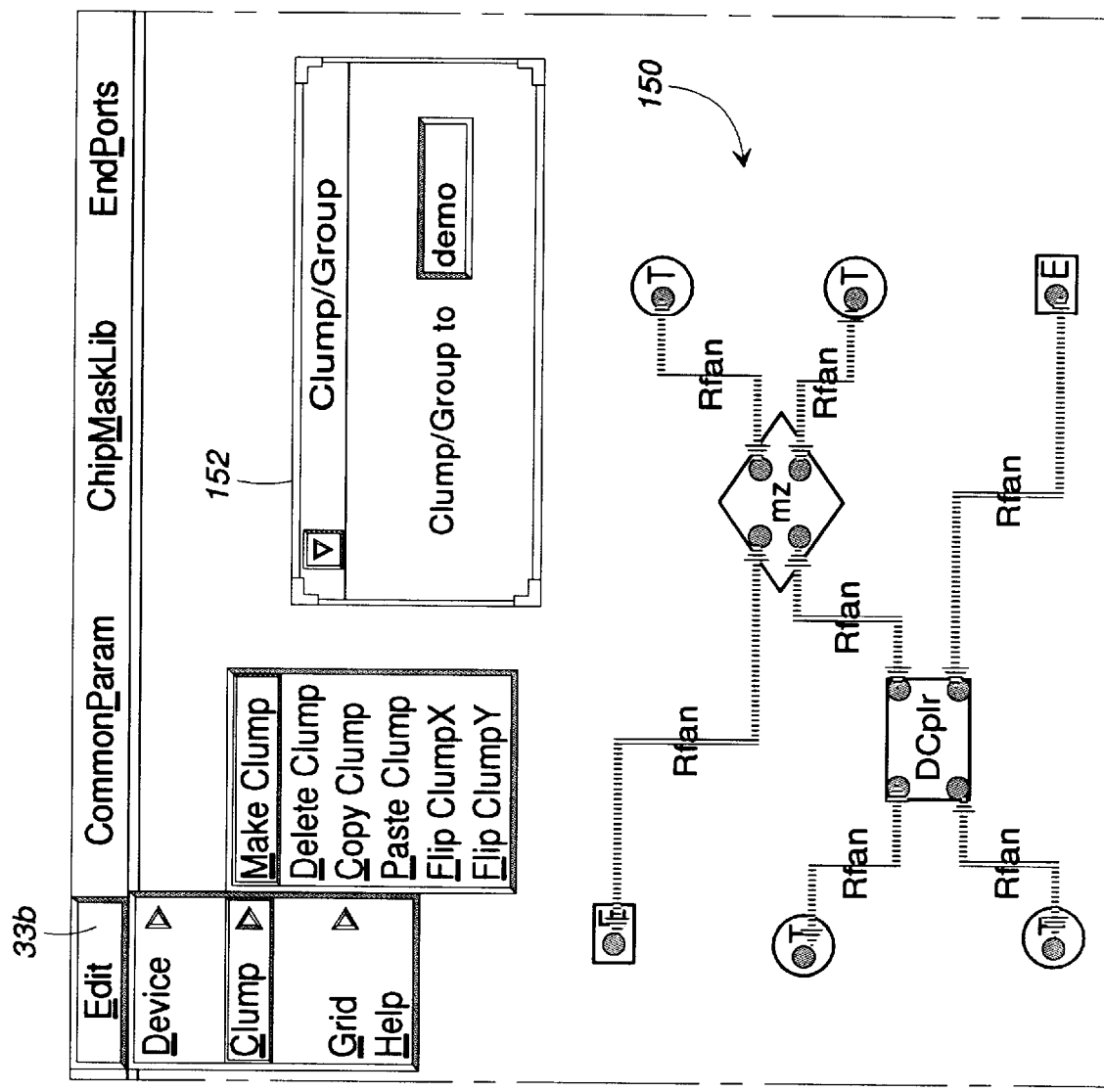

Once a desired optical circuit has been designed, the user next selects the "Clump" option under the "Edit" heading 33b and chooses the "Make Clump" option. As shown in FIG. 15(B), the computer system 10 next presents the user with a window 152 requesting a name for the CLUMP, which in this example is "demo." In response to the Clump command, the computer system 10 replaces the individual icons for the optical devices, interconnects, and end ports with a single icon 154, as shown in FIG. 15(C). In this example, the tapered end ports are labeled with "T" while the straight end ports are labeled as "E." This single icon 154 represents the various individual icons as well all identifying data for the optical components represented by those icons.

Figure 15D:
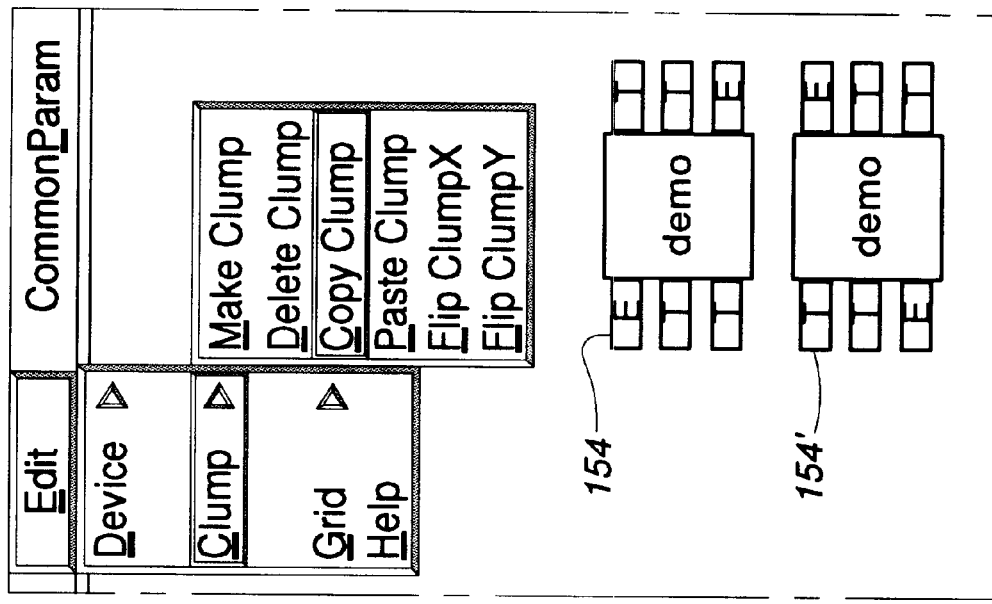
Figure 15C:
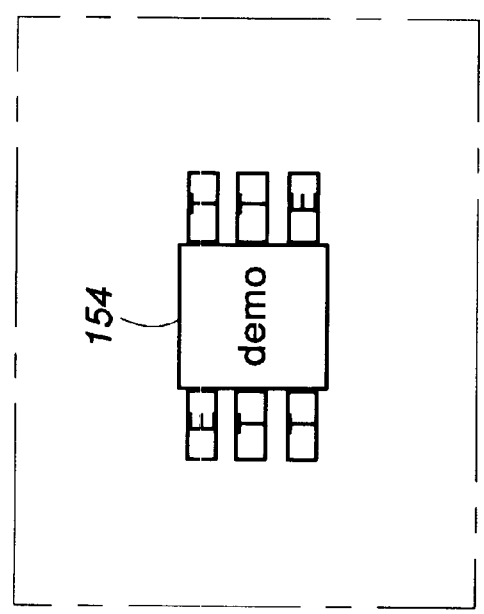

As shown in FIG. 15(D), the computer system 10 presents the user with the options of copying, deleting, or flipping the Clump icon along either its x or y axis. As an example, the "demo" circuit may be copied by first selecting the "Copy Clump" option and then double clicking on the "demo" icon 154. Next, by selecting the "Paste Clump" option, an identical clump icon 154 will be added to the canvas 134. To flip a clump, the user selects the "FlipClumpY" or "Flip ClumpX" option followed by a double click on the "demo" clump icon. As shown in FIG. 15(D), a second "demo" icon 154' has been added to the canvas which is flipped with respect to the y-axis of the icon. While in this example a chip is being designed with multiple icons named "demo," the computer system 10 can be used to design chips having different optical circuits.

Figure 15E:
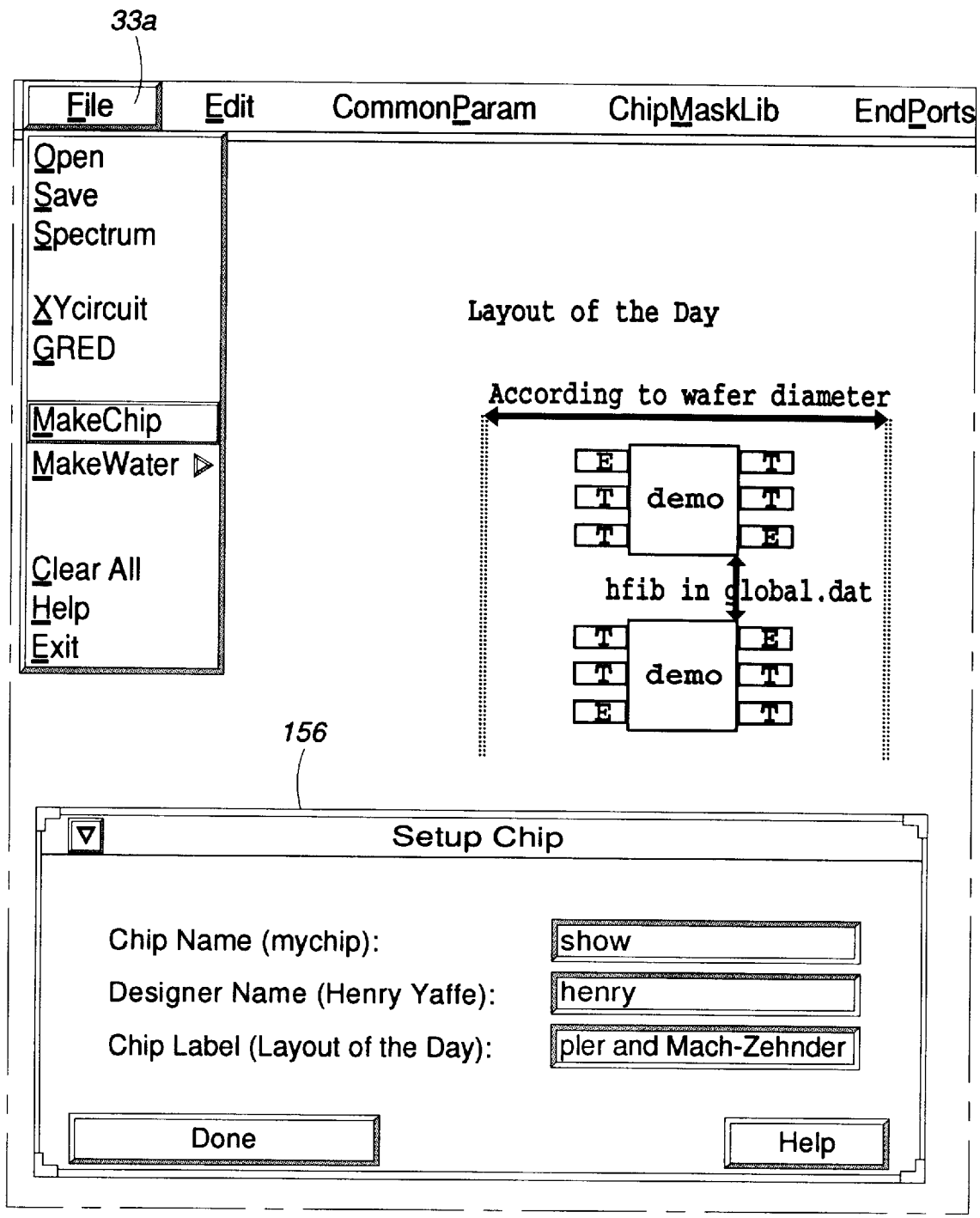

To make a chip, the user selects the "MakeChip" option under the "File" heading, as shown in FIG. 15(E). The computer system 10 next displays a menu window 156 entitled "Setup Chip" which prompts the user for a chip name, a designer name, and a label for the chip. The computer system 10 will activate the mask layout driver after the user has clicked on the "Done" command within the "Setup Chip" window 156. In generating the xy mask, the mask layout driver will include the information entered in the "Setup Chip" window 156 in the mask and this information can be viewed with "GRED."

Figure 15F:
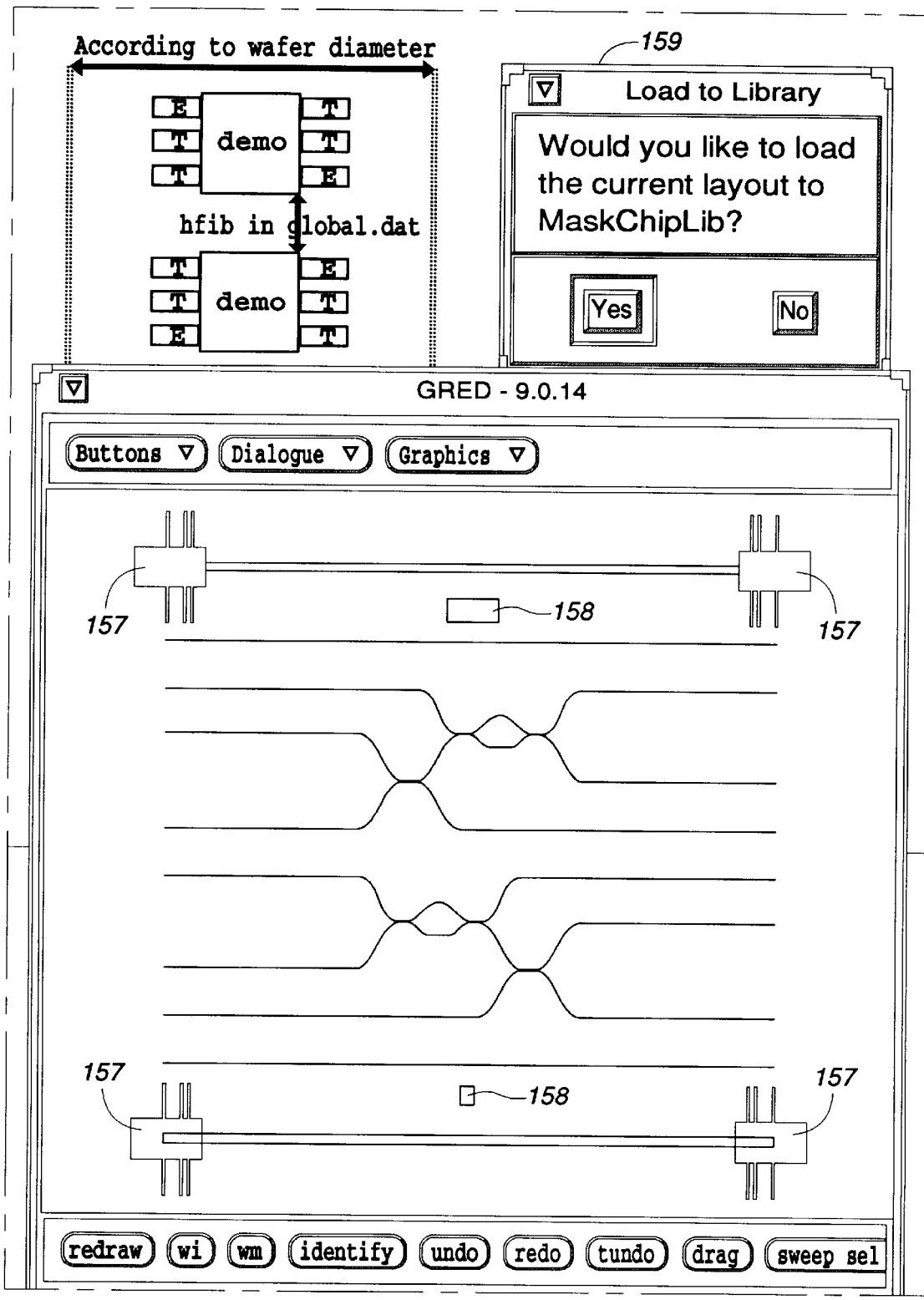

As with any optical circuit, the computer system 10 is also able to provide a visual confirmation of the mask layout of a chip. To obtain this visual confirmation, the user selects the "GRED" option under the "File" heading 33a and enters the name of the chip. As shown in FIG. 15(F), the two clumps are mirrored about the y-axis relative to each other and the waveguides are tapered at the ends that have the tapered end ports. Additionally, dicing marks 157 and chip labels 158 are automatically generated by the mask layout driver and are shown with "GRED." The view in FIG. 15(F) has a stretch ratio of 10:1 in the y-direction relative to the x-direction whereby the chip labels 158 are not readable but are only discernable as two blocks.

Figure 15G:
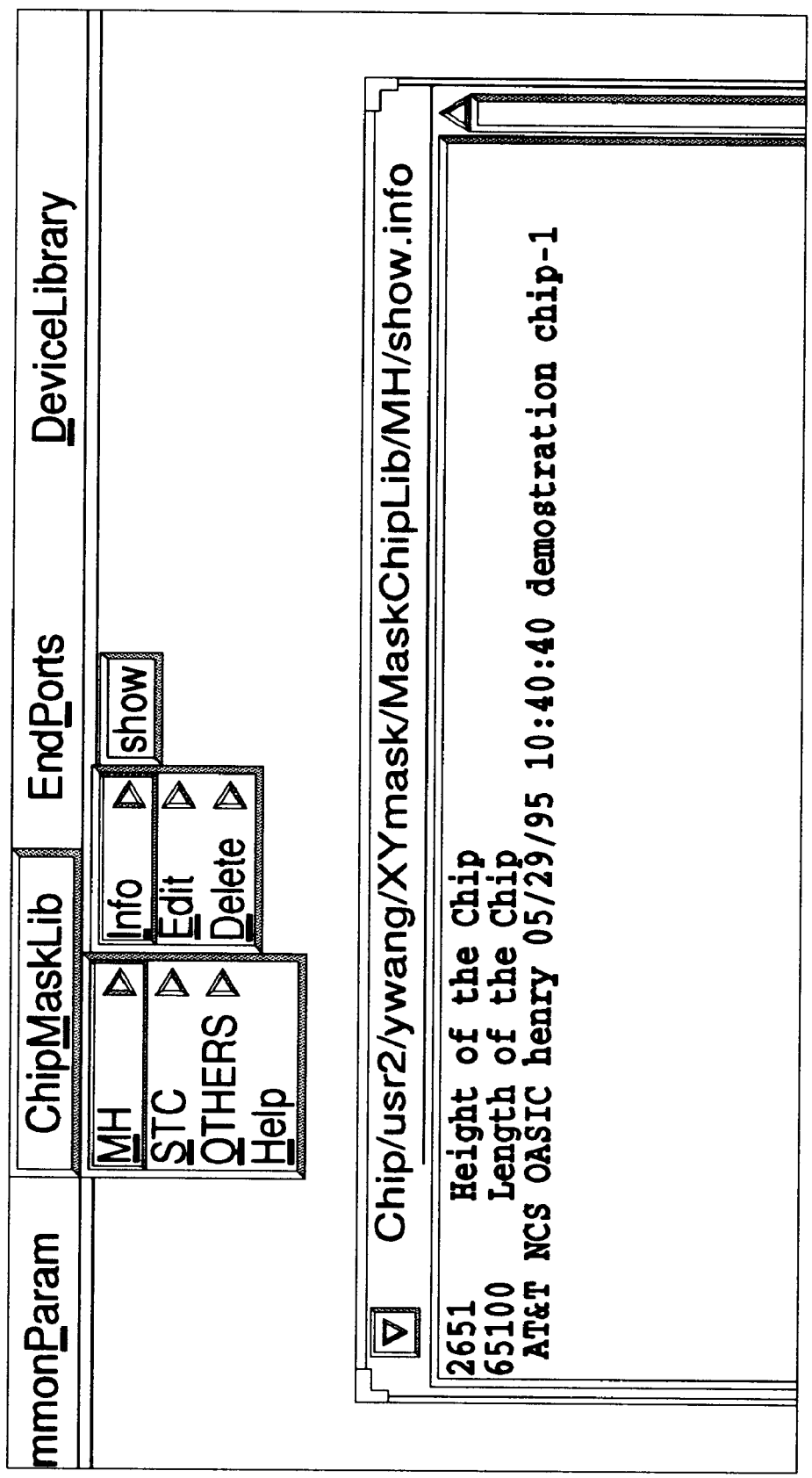

To save this chip to a chip library, the user clicks on the "Yes" option within the "Load to Library" menu 159, which is shown in FIG. 15(F) and which is presented after the mask layout of the chip has been generated. As shown in FIG. 15(G), the saved chip labeled as "show" is listed under the "MH" manufacturing standard since the chip was generated using this manufacturing standard. The computer system 10 permits the user to delete, view, or edit any of the chips within the library. For instance, to view the chip "show", the user selects the "Info" menu item under the "ChipMaskLib" heading 33d and slides the cursor over to the "show" option. As shown in FIG. 15(G), brief information concerning the chip's height, length, and other characteristics are displayed by the computer system 10.

Figure 16A:
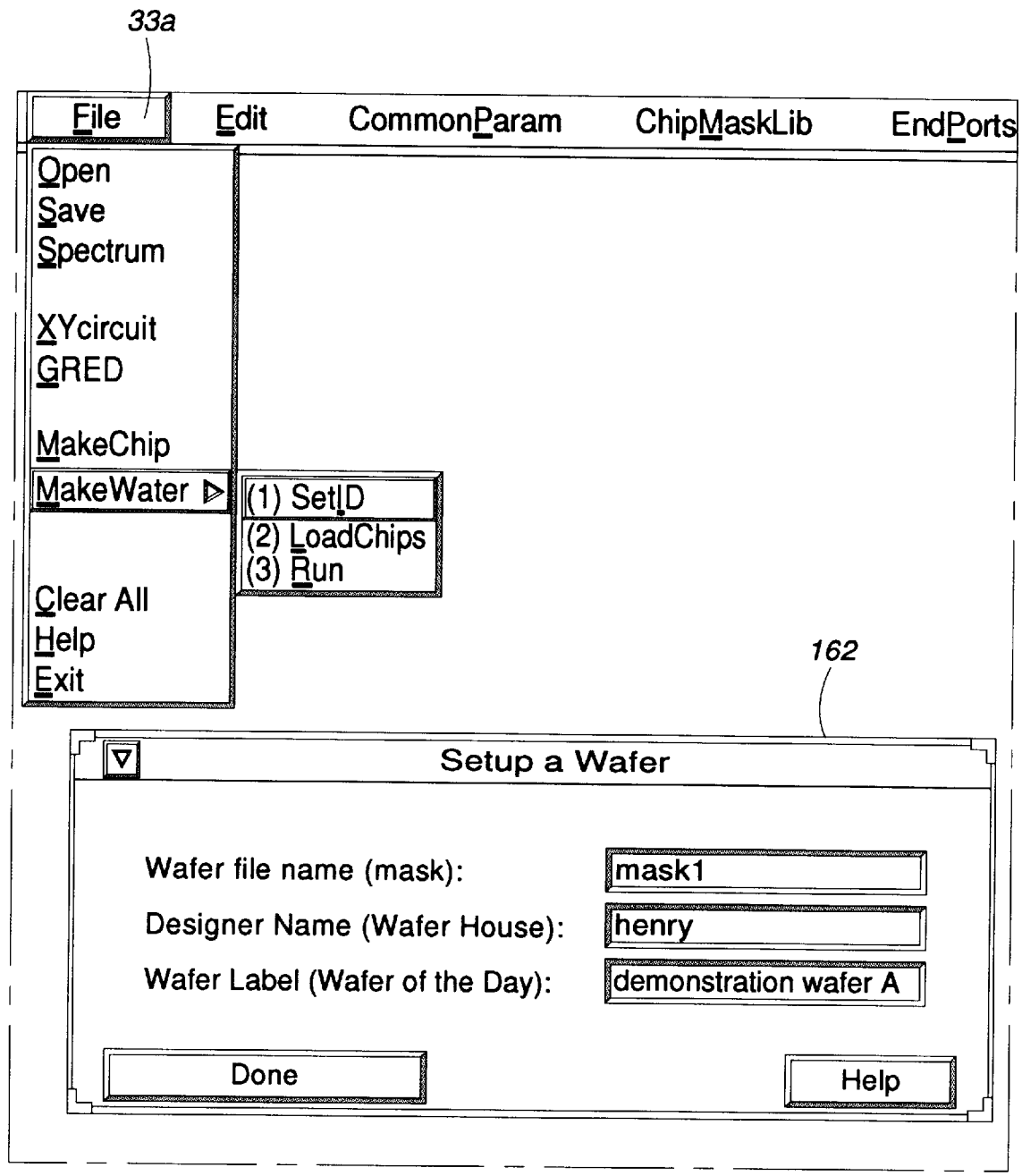

The computer system 10 may also be used to generate a wafer, which is the final step in a mask layout. As shown in FIG. 16(A), the selection of "MakeWafer" option under the "File" heading 33a causes the computer system 10 to display the three steps necessary to generate a wafer. As shown in FIG. 16(A), by selecting the "SetID" step, the computer system 10 displays a "Setup a Wafer" menu window 162. Within this window 162, the user is prompted for information such as the name of the wafer, the designer's name, and a label for the wafer. The computer system 10 displays the default values for this information within parentheses next to the prompted information. Thus, if the user does not enter any information, the default values will be used by the computer system 10 in generating the wafer.

After entering identifying information in the first step, the user next selects the "LoadChips" option under "MakeWafer." This second step in the process permits the user to load the chips from the mask chip library which will be used in the production of a desired wafer. Upon selection of the "LoadChips" step, as shown in FIG. 16(B), the computer system 10 displays a "chipselection" widget 164 which has a left side showing the library of chips available for use within a wafer and a right side showing the chips selected for a new wafer. Initially, the right side of the "chipselection" widget 164 is empty and the left side shows the available chips, which in this example is only the "show" chip. To transfer a chip from the left side to the right side of the "chipselection" widget 164, the user simply clicks on the desired chip item, such as "show", and the chip will be transferred to the right side of the window. The user can load as many chips as desired by repeatedly clicking on the chip's name, as shown in FIG. 16(C). To delete a chip from the wafer, the user simply clicks on the chip's name on the right side of the "chipselection" widget 164.

Figure 16D:
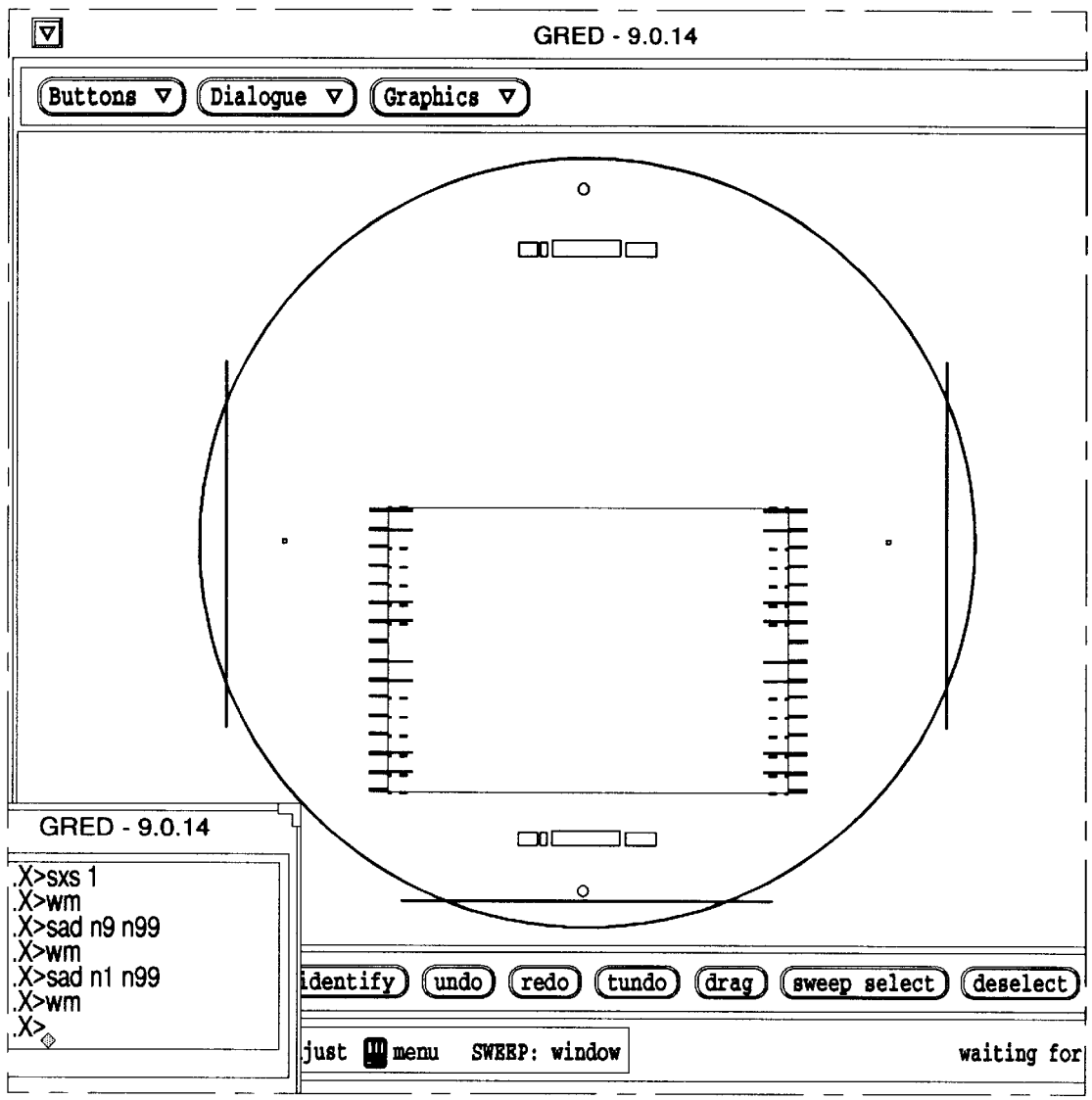
Figure 16E:
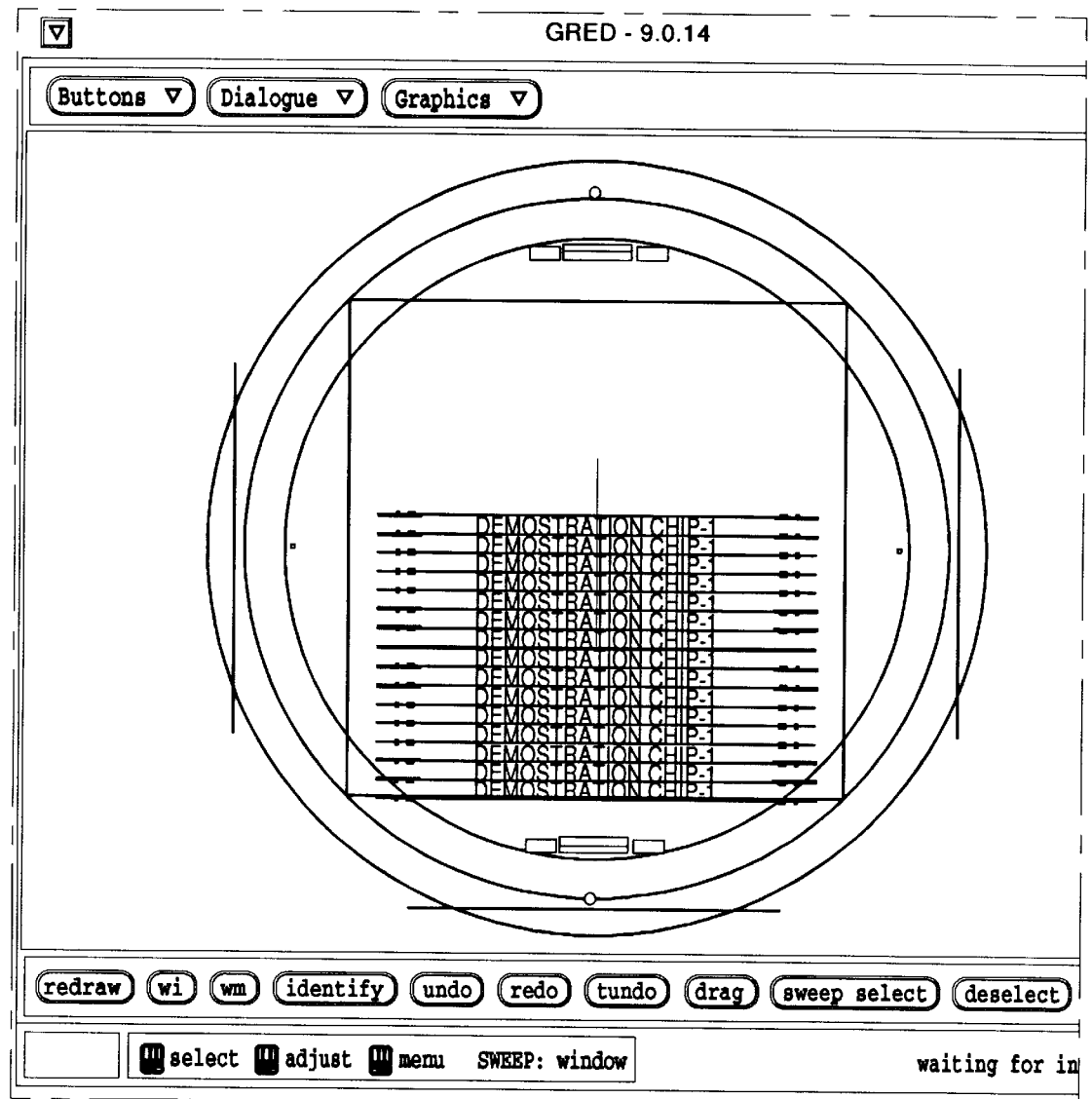
Figure 16F:
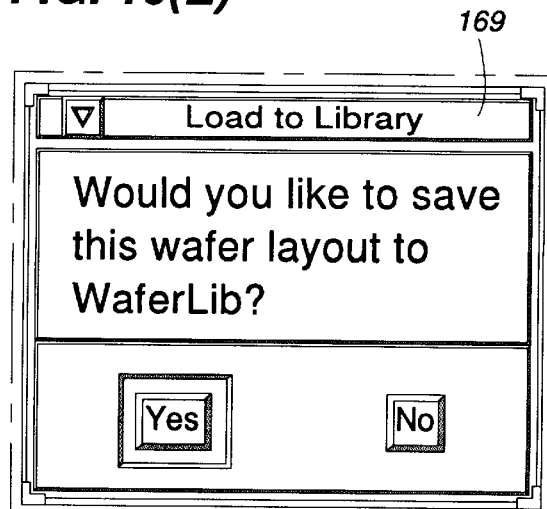

To generate a mask file for the wafer, the user selects the "Run" step under the "MakeWafer" option. In response, the computer system 10 will activate the mask layout driver which will then generate a mask layout for the wafer. In this example, the mask layout driver will generate a mask file entitled "mask1.x" since "mask1" was the user-specified name for the wafer. After activating "GRED," the user can receive visual confirmation of the wafer layout at the waveguide level and chip outline level, as shown by FIGS. 16(D) and 16(E), respectively. As shown in these figures, the NCITD markers are displayed at the top and bottom of the wafer as well as the PEP markers. As shown in FIG. 16(F), the user can save the wafer to the wafer library by clicking on "Yes" in the "Load to Library" window 169 which is presented after the generation of the wafer layout.

Figure 17:
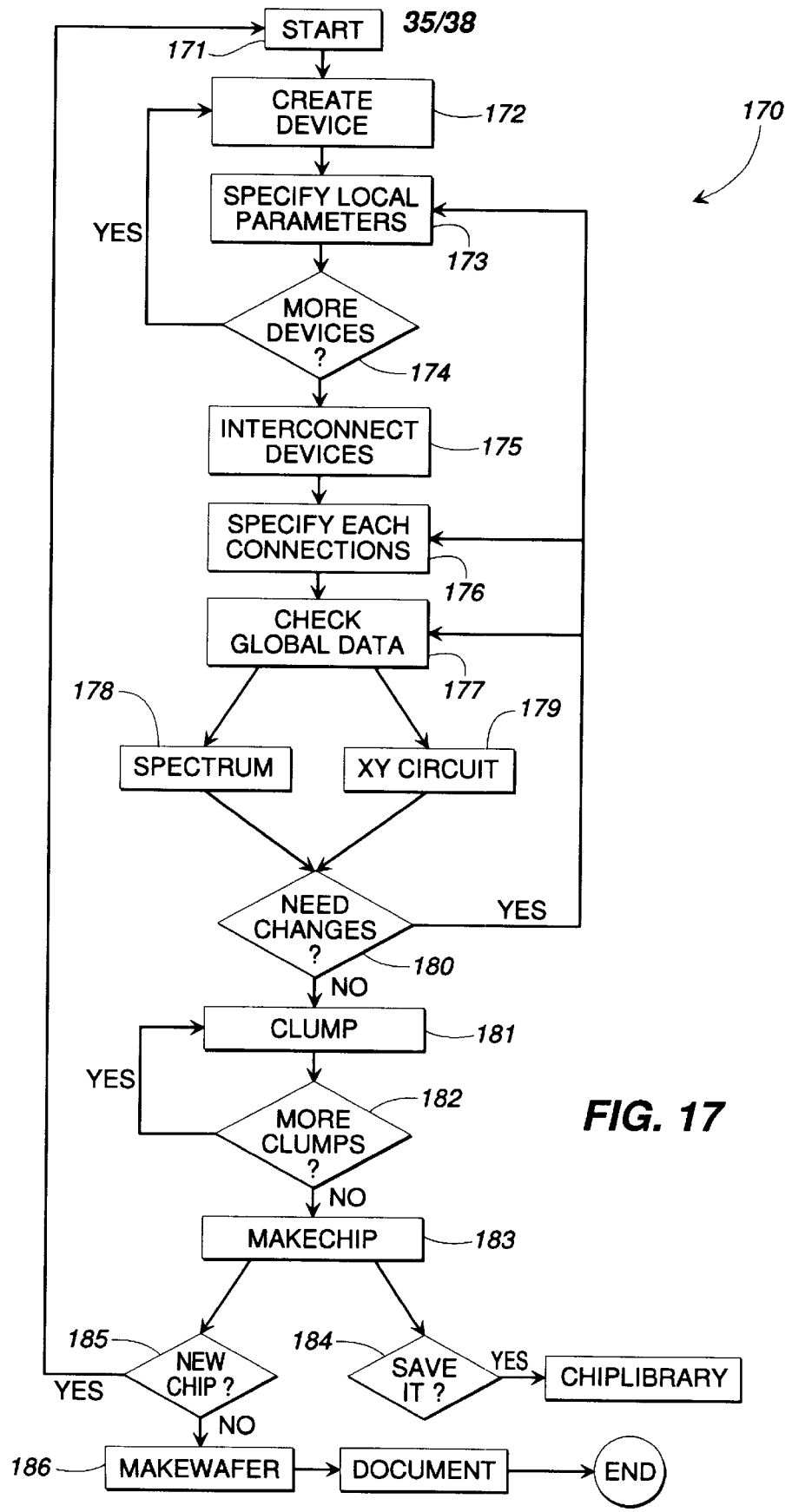
FIG. 17 is a flow chart depicting an exemplary process according to the invention for designing, analyzing, and laying out optical circuits, chips, and wafers.

A method 170 roughly summarizing the steps in designing, analyzing, and laying out a circuit, chip, and wafer is shown in FIG. 17. It should be understood that the invention can be practiced in ways other than that shown and that FIG. 17 only illustrates one possible process by which the invention may be practiced. With reference to FIG. 17, a method 170 according to the invention comprises the step 172 of creating a device and then specifying 173 the local parameters for that device. If desired, the user can add additional devices at step 174 and specify the local parameters for those additional devices.

With at least two devices placed on the canvas 34, the method 170 proceeds to the next step of interconnecting 175 the devices with user-specified interconnects and then specifying 176 the local parameters for each of the interconnects. Once the devices have been interconnected and the user has checked the local parameters at step 177, the user can either verify the optical circuit by invoking the "Spectrum" command at step 178, so as to receive a spectral analysis of the circuit, or the user may invoke the "XYcircuit" and "GRED" commands at step 179, so as to receive a visual confirmation of the circuit. The user, of course, need not receive any type of confirmation or, alternatively, may desire to receive both a spectral analysis and a visual confirmation of the circuit. In case changes need to be made to the circuit, as determined at step 180, the user can alter the local parameters for one or more of the devices or the interconnects or the user may modify the global data.

Once an optical circuit has been designed which performs as desired, the user may then clump the circuit together into a single icon at step 181. The user may subsequently add additional devices or interconnects to the clump and may then perform further clumps at step 182. After the entire optical circuit has been designed and has been clumped together, the user can save the chip at step 184 or may begin to design a new chip at step 185. After all of the chips have been designed, the user may then proceed to make a wafer at step 186.

VI. Mask layout Driver

In general, the mask layout driver translates the various icons forming an optical circuit into an xy plot of the individual waveguides forming the optical circuit. More specifically, the mask layout driver generates an xy mask which can be used by a fabrication center to manufacture the specified optical circuit. To define the mask layout of the various devices, interconnects, and end ports, the mask layout driver digitizes the optical components on a grid. The plots formed on the grid form lines which define the boundaries of the waveguides within the optical circuit.

Figure 18A:
Figure 18B:
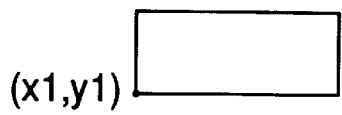
Figure 18C:
Figure 18D:
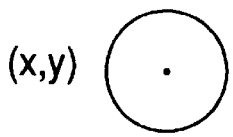
Figure 18E:
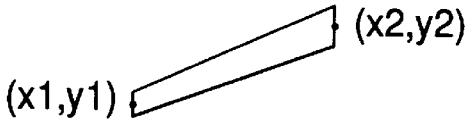
Figure 18F:
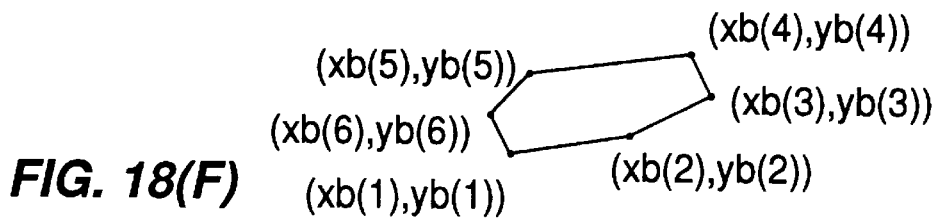

The mask layout driver defines the optical paths within the optical circuit by combining basic geometric shapes. For each of these basic geometric shapes, the mask layout driver has a subroutine for plotting that specific shape. For instance, with reference to FIG. 18(A), a subroutine called PATH plots a waveguide path from a point x1,y1 to a point x2,y2 at a certain level in the wafer and having a certain width w. In calling the subroutine PATH, the mask layout driver supplies all of the necessary information to generate the plot. Thus, in the example shown in FIG. 18(A), the mask layout driver would have a command line such as "call PATH (x1,y1,x2,y2,w,lev)."

As shown in FIGS. 18(B) to 18(H), the mask layout driver can plot other geometric shapes and can also print text. The shapes in FIGS. 18(B) to 18(F) include a rectangle, a triangle, a circle, a tapered path, and a blob, respectively. FIGS. 18(G) and 18(H) respectively illustrate block text and stick text. The call lines for the geometric shapes and text in FIGS. 18(B) to 18(H) can be represented as "RECT (x1,y1, w,h,lev)," "TRI (x1,y1,x2,y2,x3,y3,lev)," "CIRCLE (x,y,r, lev)," "TPATH (x1,y1,x2,y2,w1,w2,lev)," "BLOB1 (xb,yb, 6,lev)," "TEXT (txt,i,h,x,l,y,lev)," "STEXT (txt,i,h,x,y, lev)," respectively.

Figure 19:
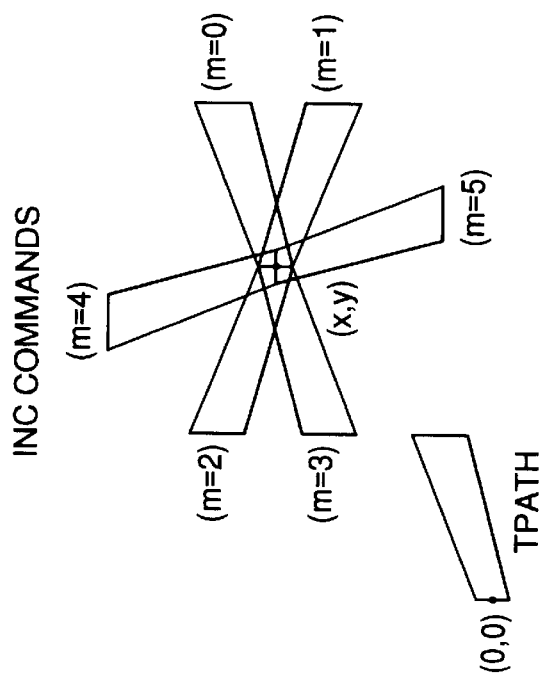
FIG. 19 is a plot of a subroutine in the mask layout driver for inclining geometric shapes.

Another common subroutine used by the mask layout driver is invoked to incline a geometric shape. For instance, as shown in FIG. 19, a subroutine INC can be used to incline a tapered path. In this example, a variable m sets the angle at which the tapered path is inclined. The tapered path may be inclined with a command line such as "call INC ('TPATH',index,x,y,m")", where index specifies the exact tapered path to be inclined.

The individual optical devices, interconnects, and end ports are plotted in a manner similar to the above-described geometric shapes in that the mask layout driver calls subroutines to plot the components and supplies the subroutines with the necessary data.

Figure 6B:
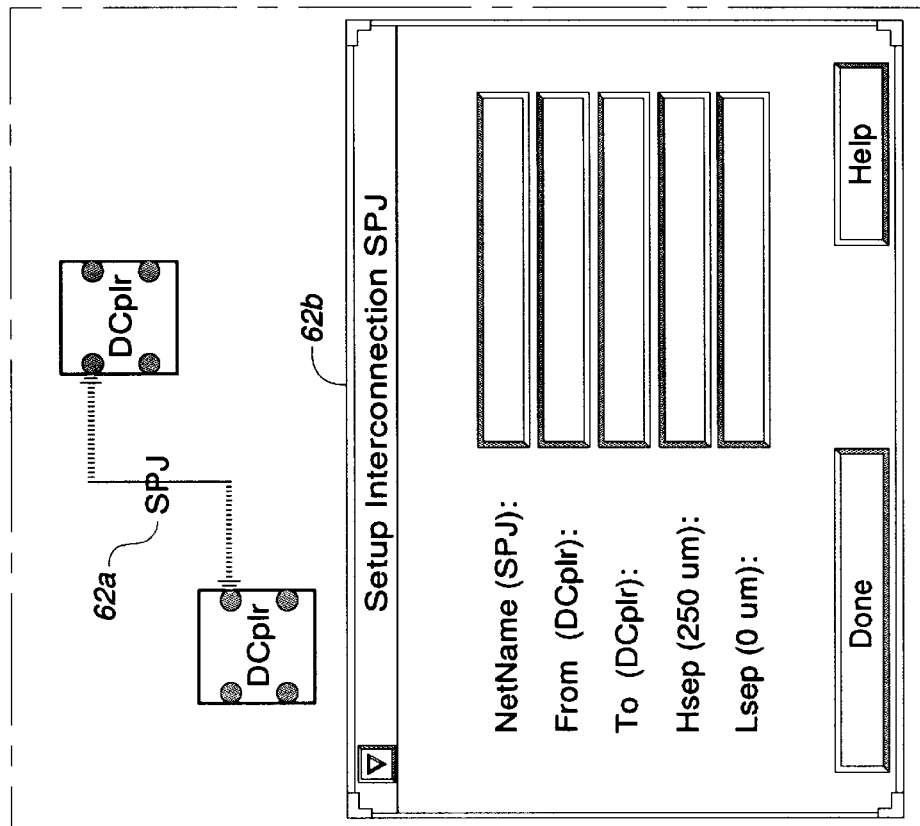
FIGS. 6(A) to (D) are views of display screens showing interconnect icons along with their local parameters.
Figure 6A:
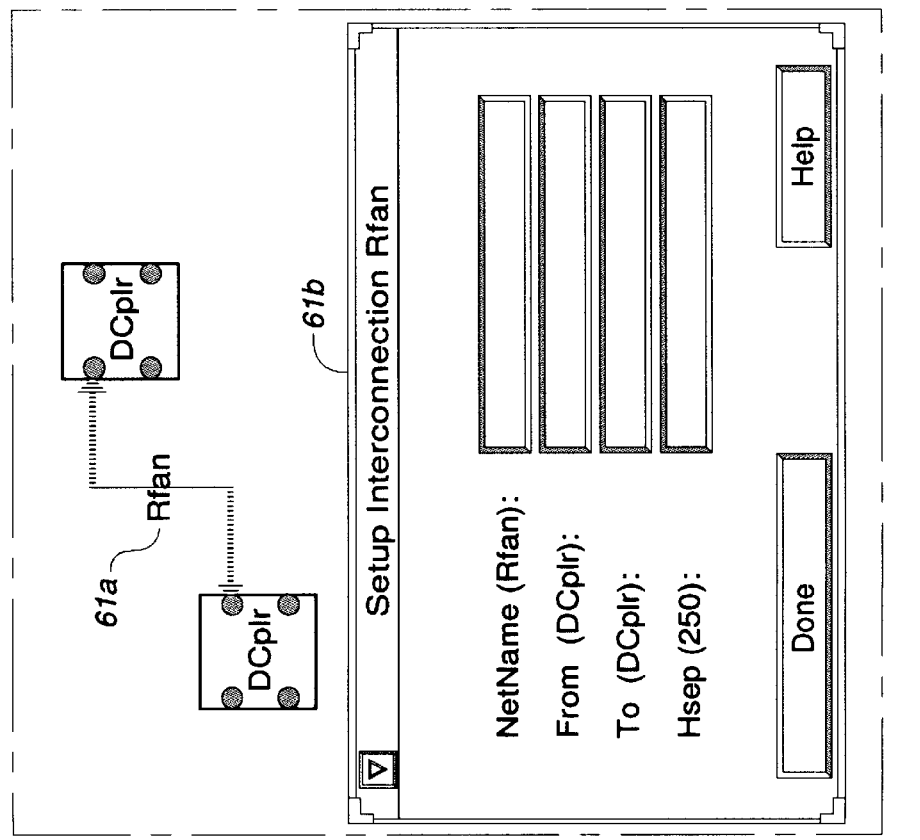
Figure 6C:
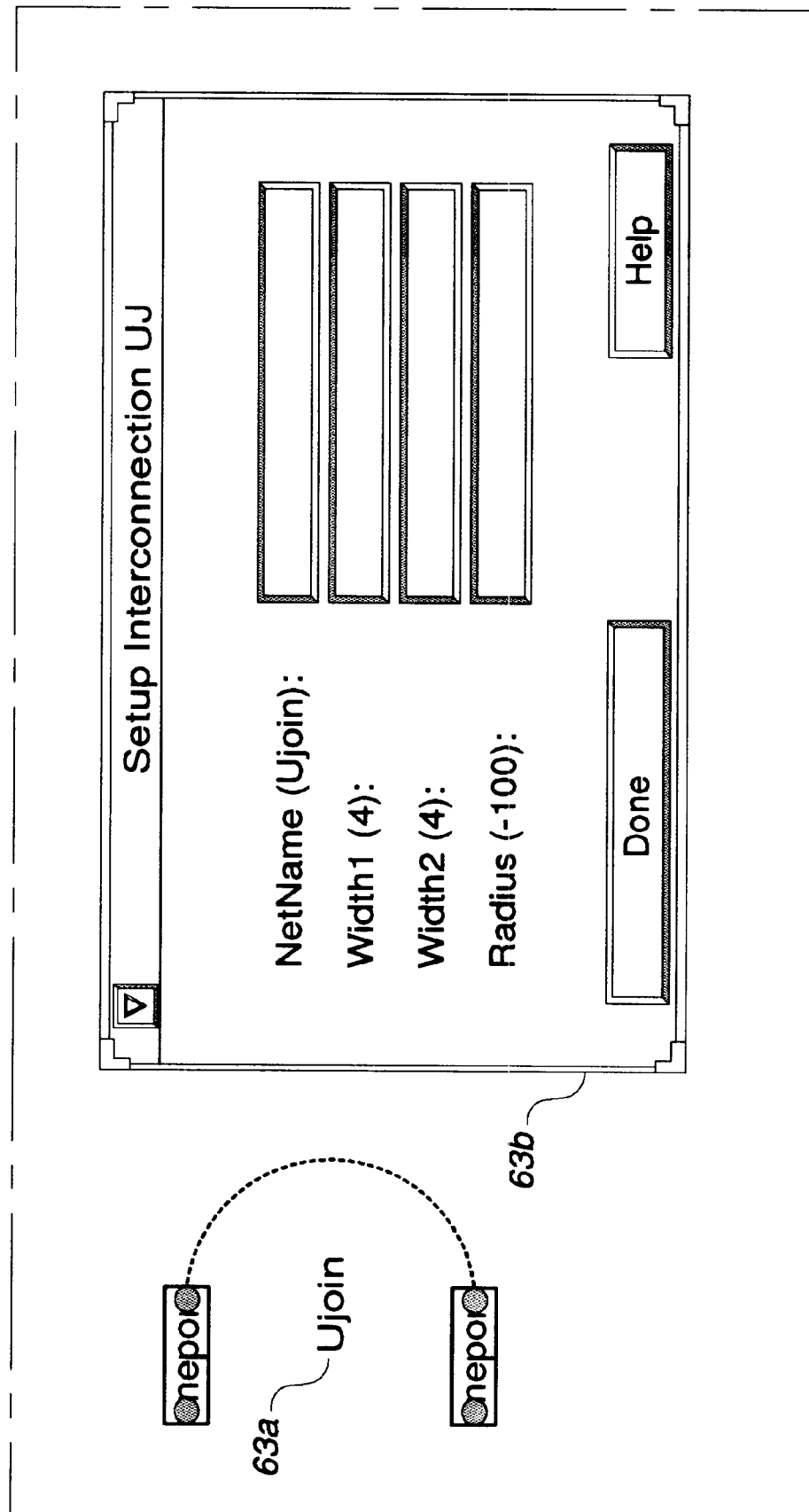
Figure 20:
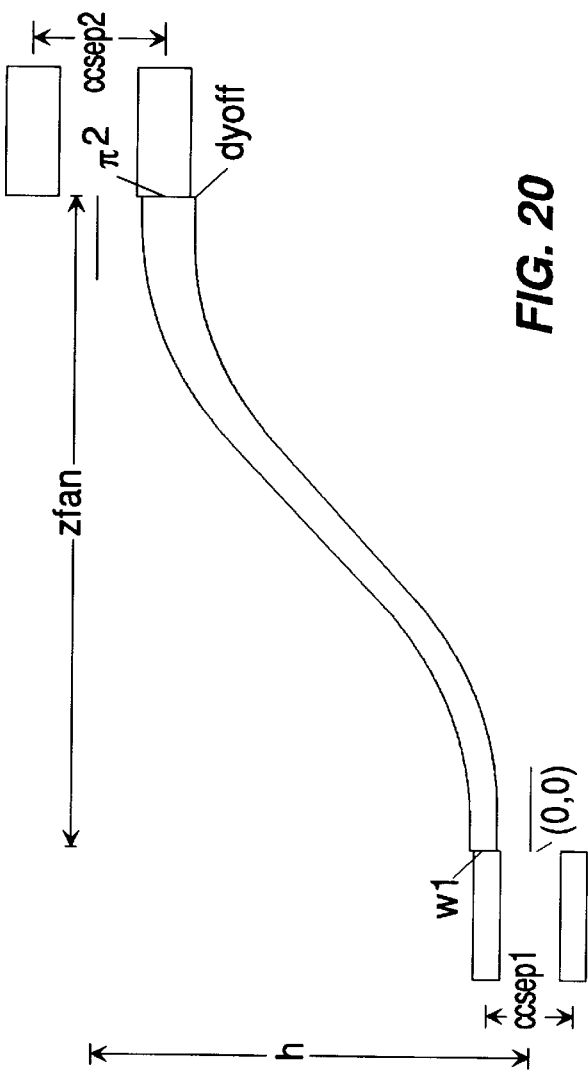
FIG. 20 is a plot of an Rfan interconnect generated by a mask layout driver according to the invention.

For instance, FIG. 20 illustrates an Rfan interconnect between two waveguides. The exact shape of the Rfan interconnect is defined by the center to center spacing about axis 1 (ccsep1), the center to center spacing about axis 2 (ccsep2), the vertical separation between axes (h), the bend offset (dyoff), the radius of curvature (rad), the initial width (w1), the final width (w2), and the length of the curve (zfan). As shown in FIG. 6(A), the separation of axes (h) and the bend offset (dyoff) are specified in the local parameters for the Rfan interconnect. Some of the other defining characteristics of the Rfan interconnect are defined by the local parameters of the optical devices that the Rfan interconnects, such as the initial width (w1), final width (w2), and center to center spacing about axes (ccsep1 and ccsep2). The exact plot of the Rfan interconnect is also determined by some of the global parameters, such as the litho grid size (grid) and the mask level of the wave guide (levg). Based on the global parameters and the local parameters for the Rfan as well as the devices that the Rfan couples, the computer system 10 determines the mathematical expression for the plot, including the radius of curvature (rad).

A suitable command line for invoking a subroutine to plot an Rfan interconnect is "call RFAN(ccsep1,ccsep2,h,dyoff, istr,grid,rad,w1,w2,levg,ic,zfan,ifan)." In this command line, istr is a straight curve flag, ic determines whether or not the interconnect is a raised cosine or a raised sine, and ifan sets the number of the curve. The manner in which the other interconnects are plotted by the mask layout driver will be apparent to those skilled in the art and, accordingly, will not be described in further detail.

Figure 21A:
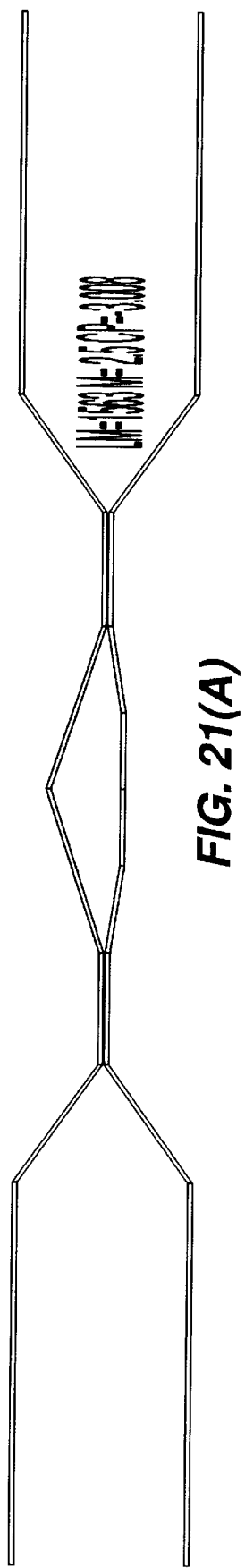
FIGS. 21(A) to 21(C) are plots of a Mach-Zehnder interferometer generated by a mask layout driver according to the invention.
Figure 21B:
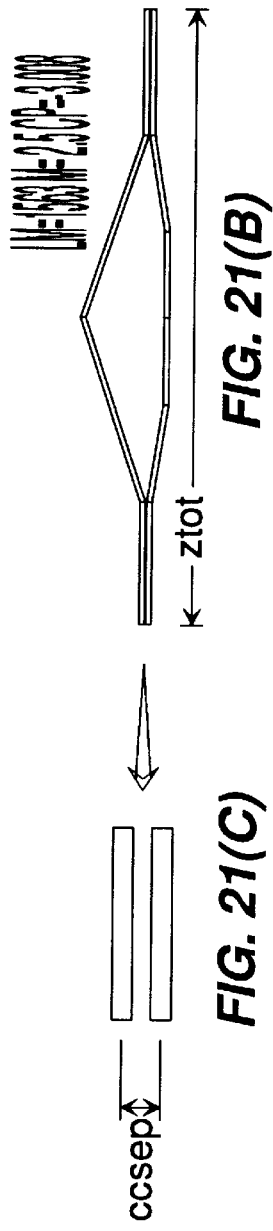
Figure 21C:
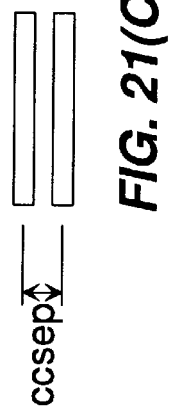

The various optical devices are plotted by the mask layout driver by combining basic geometric shapes. An example of a plot of a Mach-Zehnder interferometer generated by the mask layout driver according to the invention is shown in FIG. 21(A). FIGS. 21(B) and 21(C) respectively show the phase shifter portion of the interferometer and the center to center spacing between two waveguides in the interferometer.

A suitable command line for invoking a Mach-Zehnder subroutine is "call MZ(index,ccsep,alams,alamcp,ams,db, ltest,ztot,txt)." In this command line, index is the index of the tap clump, ccsep is the center to center separation between waveguides, alams is the wavelength of the order state or cross-state, alamcp is the wavelength of coupler, ams is the order of the interferometer, db is the attenuation, ltest is a flag that adds 250 micrometer spacing arms if the value of ltest is true, ztot is the total length, and txt is a text label. As with the Rfan interconnect, some of the data supplied in the command line for the subroutine MZ include data which is found in the local parameters for the Mach-Zehnder interferometer and others are calculated by the computer system 10 based on the local and global parameters. The manner in which the other optical devices are plotted by the mask layout driver should be apparent from the above description of the Mach-Zehnder layout and, accordingly, will not be described in further detail.

The various subroutines which are called by the mask layout driver are preferably written in g++ language. It should be understood, however, that the invention is not limited to the use of g++ but may alternatively be written in other languages, such as FORTRAN. The invention also includes a number of subroutines for plotting such items as the NCITD markers and the PET markers. The manner in which these additional subroutines function should be apparent to those skilled in the art and will not be described in full detail.

VII. Conclusion

The computer system 10 according to the invention enables one, with only a basic knowledge on how optical components operate, to design, analyze, and lay out application specific optical integrated circuits. The user of the computer system 10 need not write any dedicated program for providing a spectral analysis or any dedicated program for laying out a specific optical integrated circuit. Instead, the computer system 10 presents a plurality of different optical components which the user can selectively combine to form a desired optical circuit. The computer system 10 therefore greatly simplifies the process by which optical circuits are designed and laid out.

The computer system 10 according to the invention also permits an optical integrated circuit to be designed and laid out in just a fraction of the time previously required to design and lay out an optical circuit. With the invention, the user need not spend time writing and debugging programs and also need not track all of the parameters defining the characteristics of the optical components. Instead, the user can receive virtually instantaneous feedback on a circuit's transmission spectrum as well as a visual layout of the circuit. With this quick verification on the operation of a circuit, the optical circuit can be quickly fine tuned to operate as desired.

The computer system 10 according to the invention can also expand to accommodate evolving technologies. The computer system 10 includes a set of common parameters which are shared among all optical components and which specify a particular manufacturing standard. The user can design circuits according to any of these manufacturing standards and can also design circuits according to new standards by simply updating the set of common parameters. The ability of the computer system 10 to assist circuit designers is therefore not limited to just one manufacturing standard and is not fixed to those standards existing at a previous period of time but rather can evolve in step with advances in technology.

The foregoing has been illustrative of the features and principles of the present invention. Various changes or modifications to the invention may be apparent to those skilled in the art without departure from the spirit and scope of the invention. All such changes or modifications are intended to be included herein and within the scope of the invention.

We claim:

1. A computer-implemented method for generating a mask layout of an optical integrated circuit, comprising the steps of:

providing a plurality of selections;

representing a plurality of optical components with said selections, said plurality of optical components associated with a plurality of geometric shapes;

forming a design for the optical integrated circuit with said optical circuit including at least one of said optical components;

receiving an input;

selecting at least one of said selections during said forming step in response to said input;

associating said one of said selections with said one of said optical components;

defining said one optical component with at least one geometric shape;

retrieving parameters defining a manufacturing standard and defining dimensions of the geometric shape associated with said one optical component; and generating a plot of the geometric shape for each optical component associated with the selections that are selected in said selecting step;

wherein said plot of the geometric shape for each optical component in the optical circuit is the mask layout used to fabricate the optical integrated circuit on a substrate, said mask layout defining at least one optical waveguide in said substrate.

2. The computer-implemented method as set forth in claim 1, wherein said step of forming said design for the optical circuit comprises the step of designing said optical circuit.

3. The method as set forth in claim 1, wherein said step of defining each optical component in said optical circuit with at least one geometric shape comprises the step of dividing the optical component into a plurality of geometric shapes.

4. The method as set forth in claim 1, wherein said step of retrieving parameters for defining the manufacturing standard comprises the step of selecting any one of a plurality of different manufacturing standards.

5. The method as set forth in claim 1, wherein said step of generating the plot based on the at least one geometric shape for each optical component in the optical circuit comprises the step of transferring the geometric shape for each optical component onto a grid.

6. The method as set forth in claim 1, wherein said step of generating said plot comprises the step of generating said plot for an optical chip.

7. The method as set forth in claim 1, wherein said step of generating said plot comprises the step of generating said plot for a wafer.

8. The method as set forth in claim 1, further comprising the steps of receiving a second optical design for a second optical circuit, defining each optical component in said second optical circuit with at least one geometric shape, retrieving parameters for defining said manufacturing standard and for defining said dimensions of each geometric shape for the second optical circuit, and generating said plot to include each geometric shape for each optical component in the second optical circuit.

9. The method as set forth in claim 1, further comprising the step of adding chip labels and markers to said plot.

10. The method as set forth in claim 1, further comprising the step of displaying each geometric shape defining said plot.

11. A computer-readable medium encoded with a computer program for use in generating a mask layout of an optical integrated circuit, said computer program used with a computer system to perform the steps of:

providing a plurality of icons representing optical components, said optical components associated with geometric shapes;

receiving an input;

selectively combining said icons in response to said input;

forming a design, based on said receiving step, for the optical circuit with said optical circuit including at least one of said optical components;

defining said one optical component with at least one geometric shape;

retrieving parameters defining a manufacturing standard and defining dimensions of the geometric shape associated with said one optical component; and translating the icons combined in said combining step into a plot that indicates the geometric shape for each optical component in the optical circuit.

12. The computer readable medium as set forth in claim 11, wherein said computer readable medium is a magnetic storage medium.

13. The computer readable medium as set forth in claim 11, wherein said computer readable medium is an optical storage medium.

14. The computer readable medium as set forth in claim 11, wherein said computer readable medium comprises semiconductor memory.

15. A system for generating a mask layout of an optical integrated circuit, comprising:

a central processing unit;

a memory accessible by the central processing unit;

means for displaying a plurality of selections, said selections corresponding with a plurality of optical components, said plurality of optical components associated with a plurality of geometric shapes;

means for selecting one of said selections;

means for designing the optical integrated circuit based on selected ones of said selections, said optical circuit including at least one of said optical components;

means for defining said one optical component with at least one geometric shape;

means for retrieving parameters defining a manufacturing standard and defining dimensions of the geometric shape associated with said one optical component; and means for generating a plot of the geometric shape for each optical component that corresponds with said selected ones of said selections;

wherein said plot of the geometric shape for said each optical component is the mask layout used to fabricate the optical integrated circuit on a substrate, said mask layout defining at least one optical waveguide in said substrate.

16. The system as set forth in claim 15, further comprising means for displaying said mask layout to illustrate said geometric shapes plotted and thereby to illustrate said waveguide.

17. The system as set forth in claim 16, further comprising means for expanding a view of said plot across a width of said waveguide relative to a view of said plot along a length of said waveguide.

18. The system as set forth in claim 15, further comprising means for selecting said manufacturing standard from a plurality of manufacturing standards stored in said memory.

19. The system as set forth in claim 15, further comprising means for storing said mask layout in said memory.

20. The system as set forth in claim 15, wherein said generating means generates the plot for a chip.

21. The system as set forth in claim 15, wherein said generating means generates the plot for a wafer.

22. The system as set forth in claim 21, wherein said generating means adds chip labels and markers to said plot.

23. The system as set forth in claim 15, wherein said optical component comprises an optical device and said generating means generates the plot of said optical device.

24. The system as set forth in claim 15, wherein said optical component comprises an optical interconnect and said generating means generates the plot of said optical interconnect.

25. The system as set forth in claim 15, wherein said optical component comprises an optical end port and said generating means generates the plot of said optical end port.

26. The method of claim 1, further comprising the steps of:

generating a spectral analysis for said optical integrated circuit based on said selections that are selected in said selecting step;

displaying said spectral analysis; and changing, subsequent to said displaying step, selected ones of said selections.

27. The medium of claim 11, wherein said computer program is further used with said computer system to perform the steps of:

receiving a second optical design for a second optical circuit;

defining each optical component in said second optical circuit with at least one geometric shape;

retrieving parameters for defining said manufacturing standard and for defining said dimensions of each geometric shape for the second optical circuit; and generating said plot to include each geometric shape for each optical component in the second optical circuit.

* * * * *